United States Patent
Zeng et al.

(10) Patent No.: US 8,680,607 B2
(45) Date of Patent: Mar. 25, 2014

(54) TRENCH GATED POWER DEVICE WITH MULTIPLE TRENCH WIDTH AND ITS FABRICATION PROCESS

(75) Inventors: Jun Zeng, Torrance, CA (US); Mohamed N. Darwish, Campbell, CA (US)

(73) Assignee: MaxPower Semiconductor, Inc., Santa Clara, CA (US)

( * ) Notice: Subject to any disclaimer, the term of this patent is extended or adjusted under 35 U.S.C. 154(b) by 12 days.

(21) Appl. No.: 13/525,908

(22) Filed: Jun. 18, 2012

(65) Prior Publication Data

US 2012/0319199 A1    Dec. 20, 2012

Related U.S. Application Data

(60) Provisional application No. 61/498,753, filed on Jun. 20, 2011.

(51) Int. Cl.
*H01L 29/78* (2006.01)

(52) U.S. Cl.
USPC ........... 257/327; 257/328; 257/329; 257/332; 257/341; 257/487; 257/488; 257/E21.418; 257/E29.183; 257/E29.257

(58) Field of Classification Search
USPC ......... 257/327, 328, 329, 330, 331, 332, 341, 257/342, 487, 488, 493, E21.418, E29.183, 257/E21.41, E29.257
See application file for complete search history.

(56) References Cited

U.S. PATENT DOCUMENTS

| | | | | | |
|---|---|---|---|---|---|
| 4,546,367 | A | * | 10/1985 | Schutten et al. | 257/331 |
| 4,726,879 | A | * | 2/1988 | Bondur et al. | 438/712 |
| 4,855,017 | A | * | 8/1989 | Douglas | 438/695 |
| 4,893,160 | A | * | 1/1990 | Blanchard | 257/334 |
| 5,021,355 | A | * | 6/1991 | Dhong et al. | 438/270 |
| 5,770,484 | A | * | 6/1998 | Kleinhenz | 438/155 |
| 5,801,417 | A | * | 9/1998 | Tsang et al. | 257/333 |
| 6,191,447 | B1 | * | 2/2001 | Baliga | 257/330 |
| 6,482,701 | B1 | * | 11/2002 | Ishikawa et al. | 438/270 |
| 6,518,641 | B2 | * | 2/2003 | Mandelman et al. | 257/510 |
| 6,521,538 | B2 | * | 2/2003 | Soga et al. | 438/695 |
| 6,686,244 | B2 | * | 2/2004 | Blanchard | 438/268 |
| 6,710,403 | B2 | * | 3/2004 | Sapp | 257/330 |
| 7,250,343 | B2 | * | 7/2007 | Kotek et al. | 438/270 |
| 7,598,143 | B2 | * | 10/2009 | Zundel et al. | 438/270 |
| 7,598,144 | B2 | * | 10/2009 | Herrick et al. | 438/272 |
| 7,736,976 | B2 | * | 6/2010 | Blanchard et al. | 438/268 |
| 7,843,004 | B2 | * | 11/2010 | Darwish | 257/341 |
| 8,076,719 | B2 | * | 12/2011 | Zeng et al. | 257/330 |
| 8,080,858 | B2 | * | 12/2011 | Hirler et al. | 257/487 |
| 8,097,916 | B2 | * | 1/2012 | Poelzl | 257/330 |
| 8,420,483 | B2 | * | 4/2013 | Darwish | 438/270 |
| 2004/0031987 | A1 | * | 2/2004 | Henninger et al. | 257/328 |
| 2006/0060916 | A1 | * | 3/2006 | Girdhar et al. | 257/330 |
| 2006/0214222 | A1 | * | 9/2006 | Challa et al. | 257/328 |
| 2007/0052014 | A1 | * | 3/2007 | Takahashi | 257/330 |
| 2008/0042172 | A1 | * | 2/2008 | Hirler et al. | 257/288 |
| 2008/0073707 | A1 | * | 3/2008 | Darwish | 257/330 |
| 2008/0191307 | A1 | * | 8/2008 | Darwish | 257/493 |
| 2009/0039419 | A1 | * | 2/2009 | Zundel et al. | 257/328 |
| 2009/0090966 | A1 | * | 4/2009 | Thorup et al. | 257/328 |

(Continued)

*Primary Examiner* — Michael Shingleton
(74) *Attorney, Agent, or Firm* — Gwendolyn S. S. Groover; Robert O. Groover, III; Groover & Associates PLLC

(57) ABSTRACT

Power devices, and related process, where both gate and field plate trenches have multiple stepped widths, using self-aligned process steps.

20 Claims, 48 Drawing Sheets

(56) References Cited

U.S. PATENT DOCUMENTS

| | | | |
|---|---|---|---|
| 2009/0206924 A1* | 8/2009 | Zeng et al. | 327/581 |
| 2010/0140689 A1* | 6/2010 | Yedinak et al. | 257/330 |
| 2010/0264486 A1* | 10/2010 | Denison et al. | 257/330 |
| 2010/0308400 A1* | 12/2010 | Darwish et al. | 257/330 |
| 2011/0039384 A1* | 2/2011 | Darwish | 438/270 |
| 2011/0089476 A1* | 4/2011 | Parthasarathy et al. | 257/302 |
| 2011/0254088 A1* | 10/2011 | Darwish et al. | 257/340 |
| 2011/0298043 A1* | 12/2011 | Zeng et al. | 257/330 |
| 2011/0298044 A1* | 12/2011 | Yagi et al. | 257/330 |
| 2012/0043602 A1* | 2/2012 | Zeng et al. | 257/330 |
| 2012/0043603 A1* | 2/2012 | Takehara | 257/330 |
| 2012/0235229 A1* | 9/2012 | Probst | 257/330 |
| 2012/0286355 A1* | 11/2012 | Mauder et al. | 257/330 |
| 2013/0009240 A1* | 1/2013 | Takaishi | 257/330 |
| 2013/0049102 A1* | 2/2013 | Bobde et al. | 257/330 |
| 2013/0134505 A1* | 5/2013 | Kobayashi | 257/330 |
| 2013/0153995 A1* | 6/2013 | Misawa et al. | 257/330 |

* cited by examiner

Trench Hard Mask #1

- Grow Oxide/Deposit Nitride

- Pad Oxide (not shown for simplification)
- Form 1st SiN Spacer

- 1st Trench Etch

- Spacer Removal
- Sac Oxidation and Removal

- 2nd Trench Etch

- 3rd Trench Etch

- Pad Oxide (not shown for simplification)
- Form 2nd SiN Spacer

- Oxide fills the trench's bottom portion

- Spacer Removal
- Hard Mask Removal

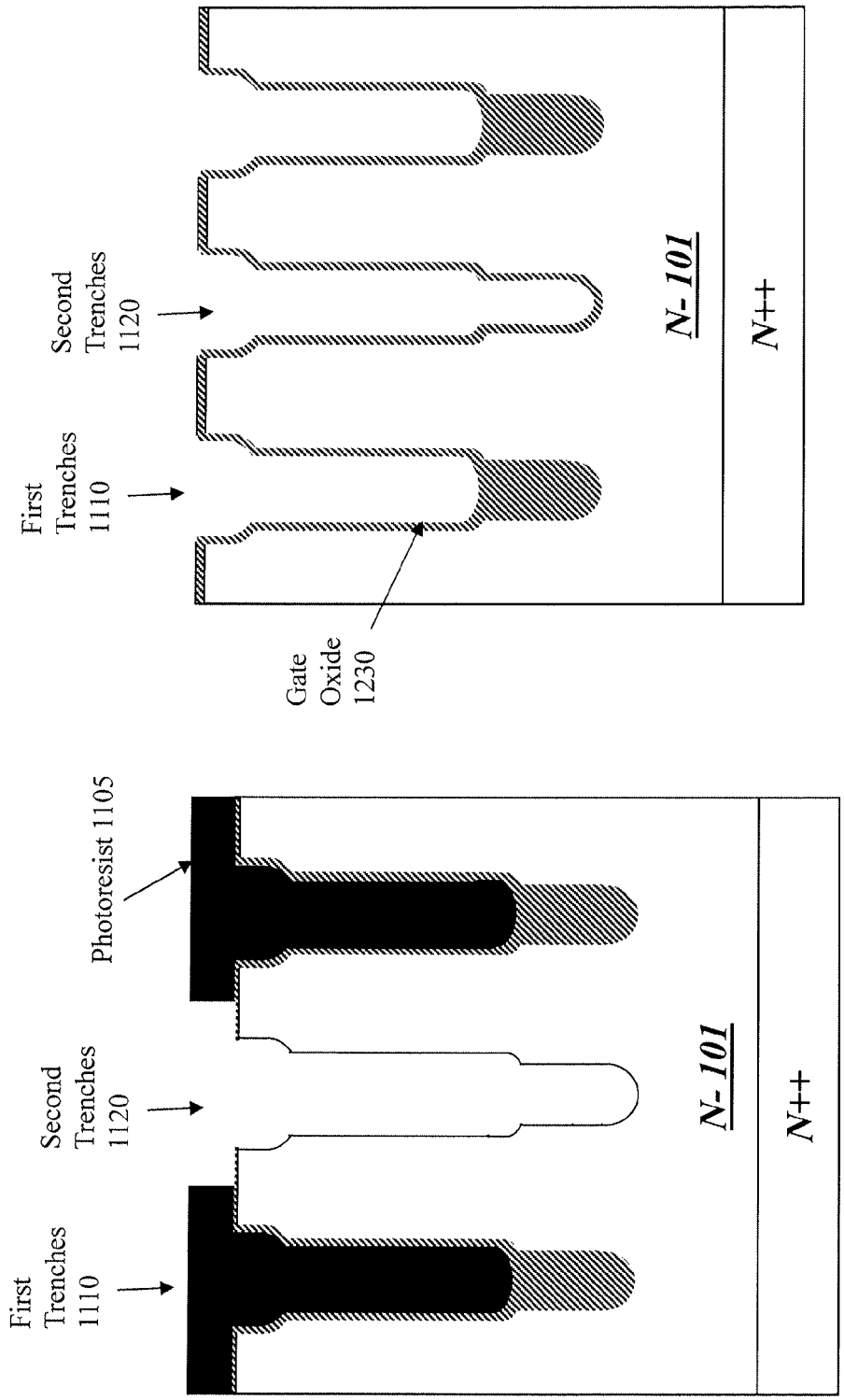

- Source Mask#3
- N+ Source Implant (As or P)

- PolySi Fill and Etch Back

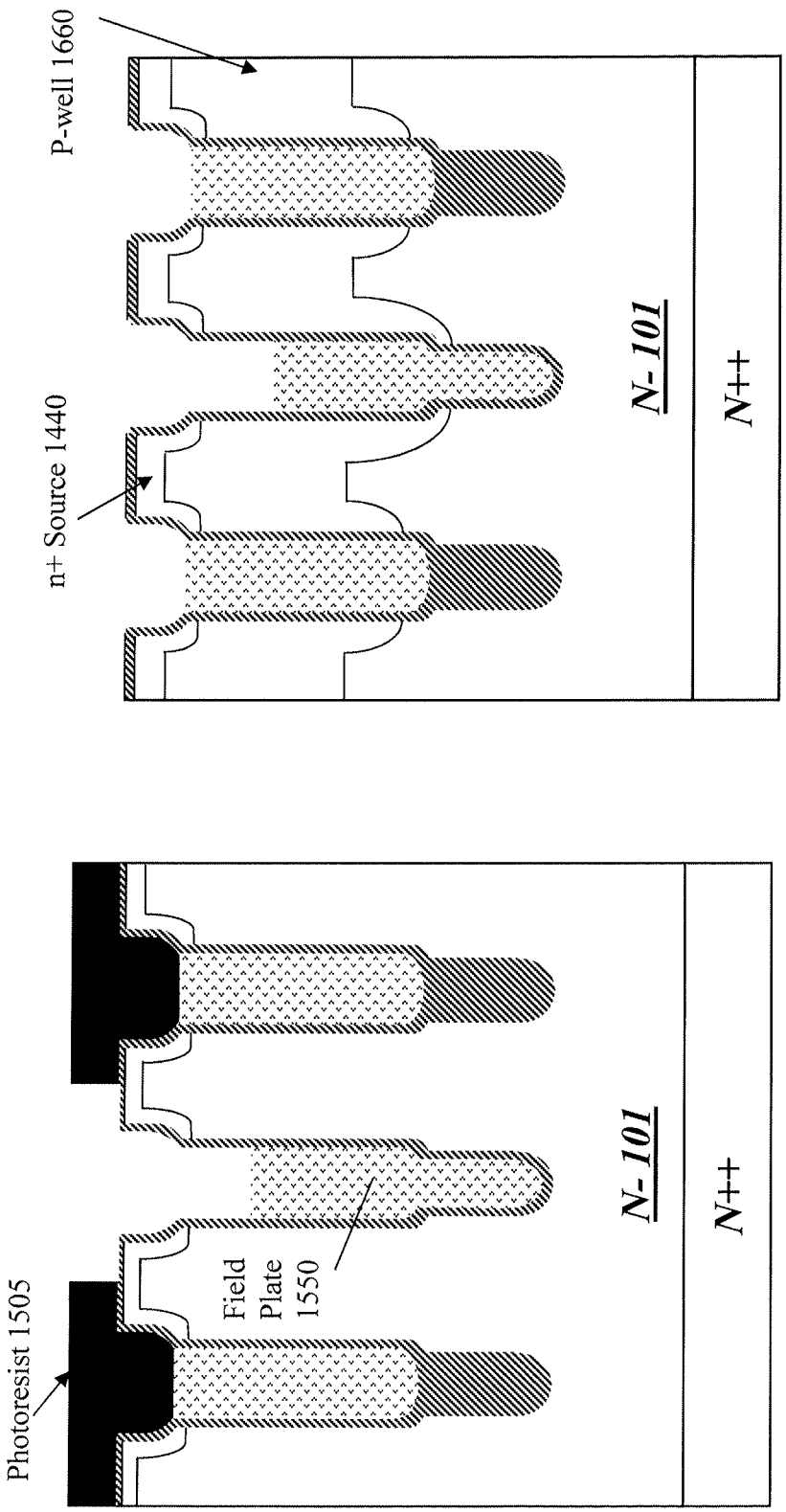

- Oxide Self-Aligned Recess

- Contact Mask #5
- Contact Etch

Front metal 2090

N- 101

N++

- Metallization
- Metal Mask #6
- Metal Etch

P+ body contact 1962

N- 101

N++

- P+ Body Contact Implant
- Anneal

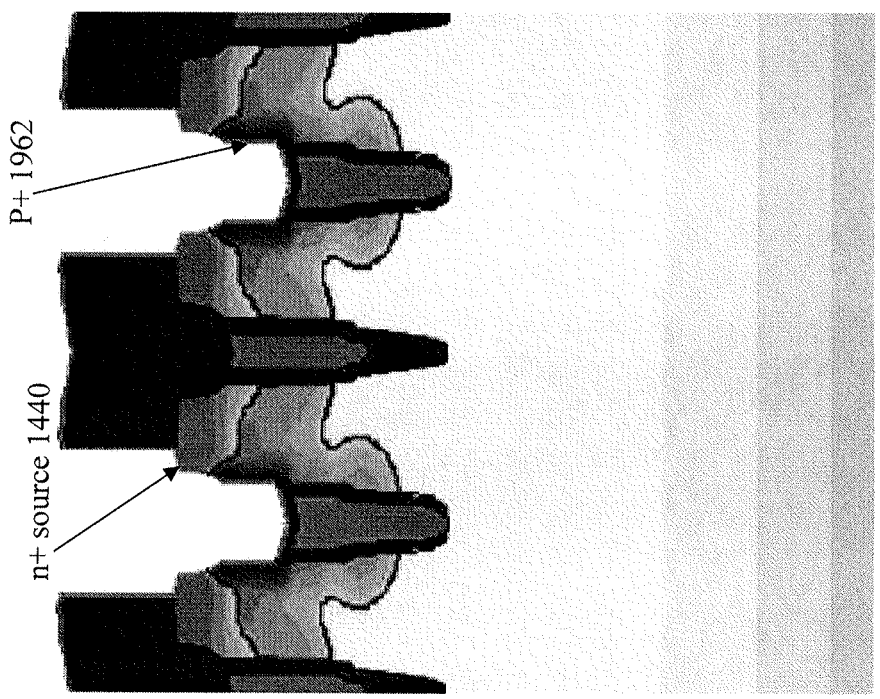
Figure 22: Device structure and doping profiles from 2-dimensional simulation

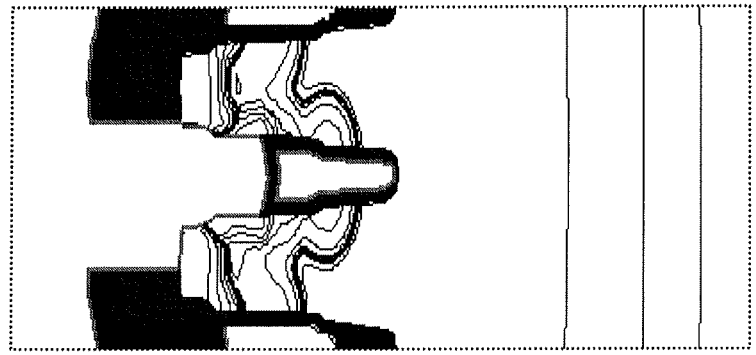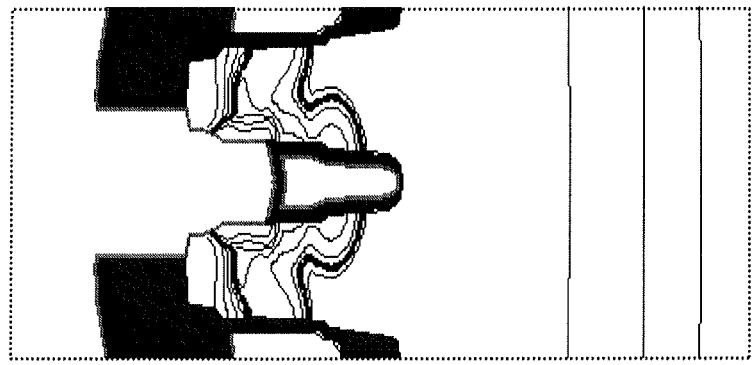
Figure 23: Contact Misalignment

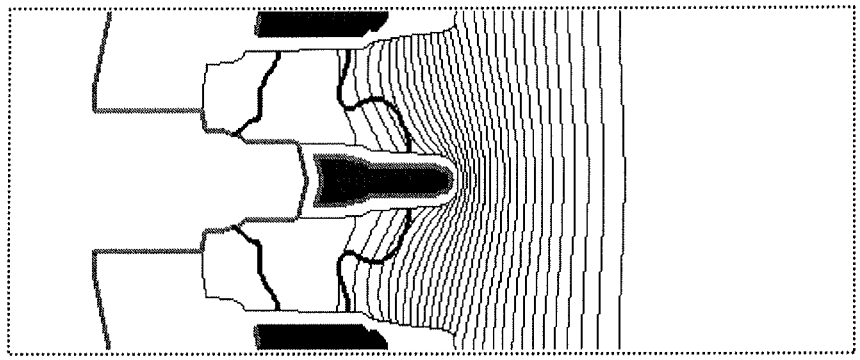
Figure 24. Potential contours at the device breakdown

Trench Hard Mask #1

- Grow Oxide/Deposit Nitride

- Pad Oxide
- Form 1st SiN Spacer

- 1st Trench Etch

- Spacer Removal
- Sac Oxidation and Removal

- 2nd Trench Etch
- Local doping enhancement implant (Phos)

- Pad Oxide (not shown for simplification)
- Form 2nd SiN Spacer

- 3rd Trench Etch
- Local doping enhancement implant (P or As)

- Spacer Removal
- Hard Mask Removal

- LOCOS oxidation to fill the bottom portion

- Pad Oxide Removal
- Gate Oxidation

- BOX mask#2
- BOX Oxide Removal
- Boron Implant

- Source Mask#3
- N+ Source Implant (As or P)

- PolySi Fill and Etch Back

- P-well Implant (B)
- Anneal

- Poly Mask #4
- Field Plate PolySi Recess

- Oxide Self-Aligned Recess

- Contact Mask #5
- Contact Etch

- Metallization
- Metal Mask #6
- Metal Etch

- P+ Body Implant
- Anneal

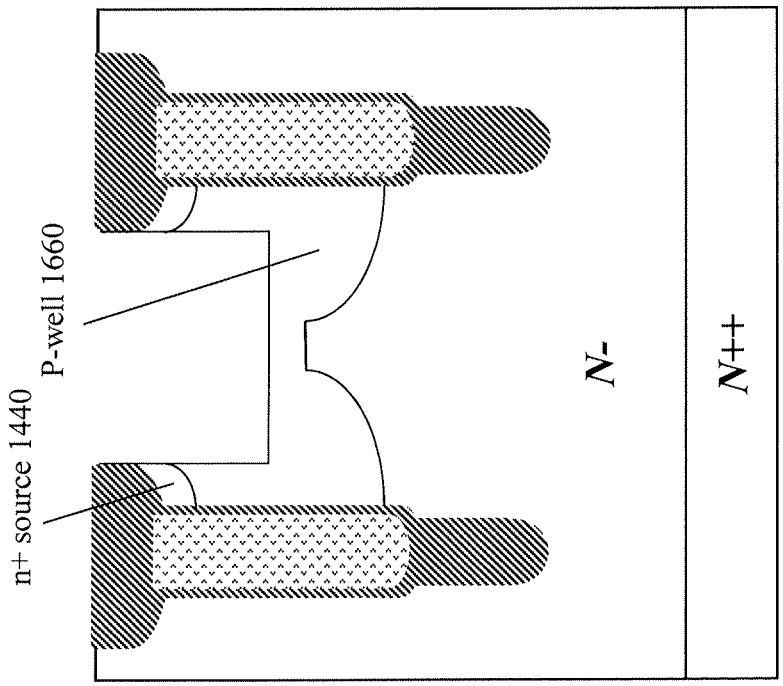
Figure 46 — Self-aligned Contact Etch
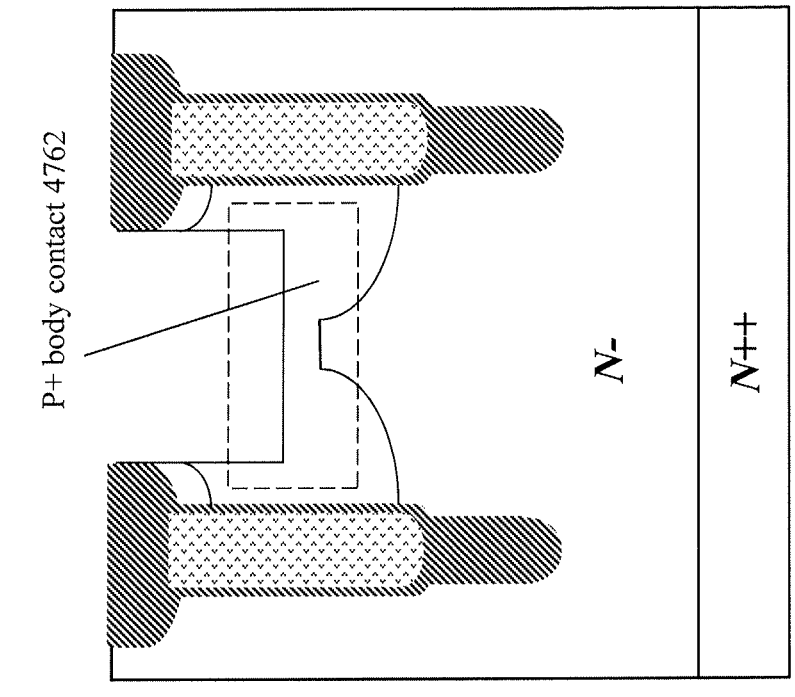
Figure 47 — Self-aligned P+ Body Implant (B11/BF2)

Oxide Self-Aligned Recess

- Etch or CMP surface oxide
- Contact Mask#5
- Contact Etch

- Metallization
- Metal Mask#6
- Metal Etch

- P+ Body Implant
- Anneal

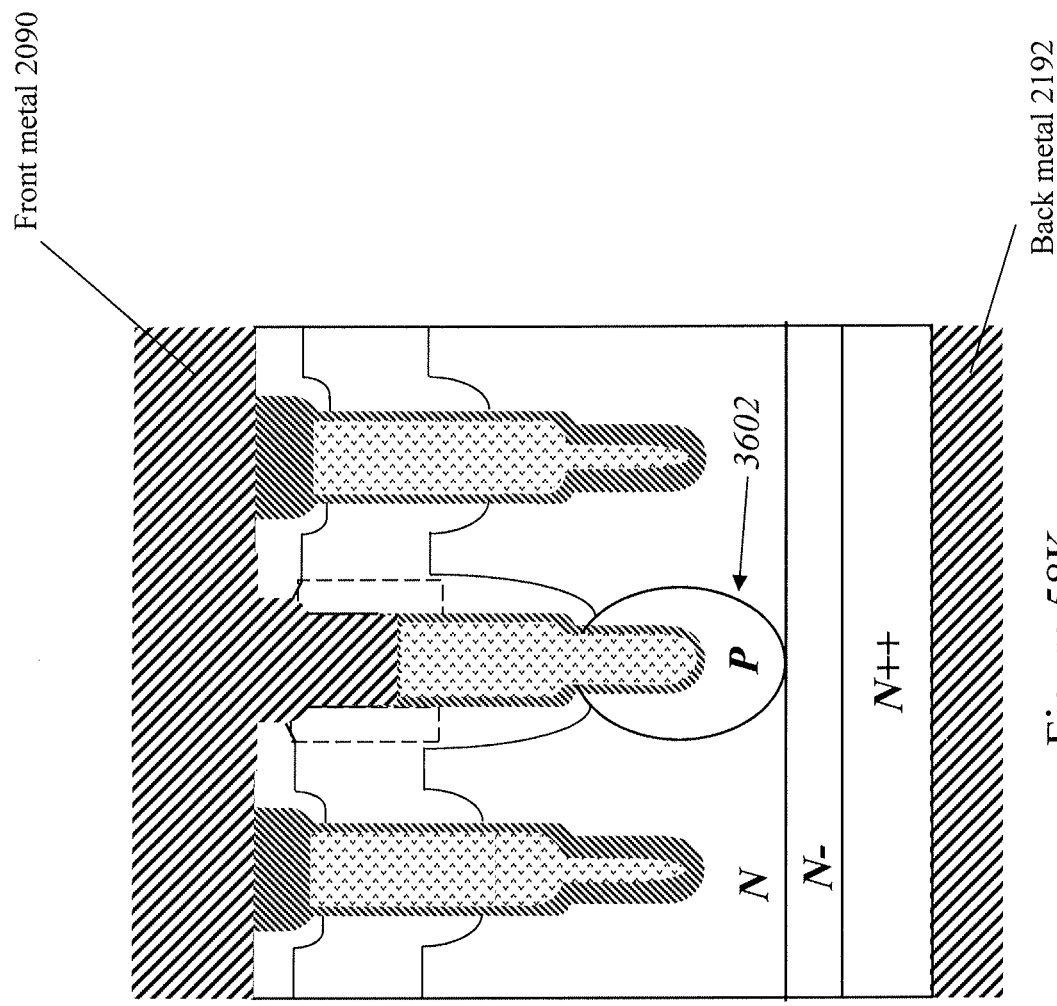

TRENCH GATED POWER DEVICE WITH MULTIPLE TRENCH WIDTH AND ITS FABRICATION PROCESS

CROSS-REFERENCE

Priority is claimed from U.S. patent application 61/498,753 filed 20 Jun. 2011, which is hereby incorporated by reference.

BACKGROUND

The present application relates to power semiconductor devices, and more particularly to trench-gated power transistors having vertical current flow, especially in an embedded-recessed-field-plate structure.

Note that the points discussed below may reflect the hindsight gained from the disclosed inventions, and are not necessarily admitted to be prior art.

BRIEF DESCRIPTION OF THE DRAWINGS

The disclosed inventions will be described with reference to the accompanying drawings, which show important sample embodiments and which are incorporated in the specification hereof by reference, wherein:

FIGS. 1-20 show successive steps in a first example of a manufacturing process which implements many disclosed innovations.

FIG. 22 shows the internal doping profiles in the structure of FIG. 21.

FIG. 23 shows results of a comparative simulation to check sensitivity to lithographic misalignment.

FIG. 24 shows potential contours at the onset of the device breakdown, in a device like that of FIG. 21.

FIG. 46, FIG. 47, and FIG. 48 show some intermediate points in a third, process example, as well as modified device structures.

FIG. 58K shows yet another variation on various of the disclosed innovative concepts.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present application describes new structures for trench-gated power semiconductor devices, and new processes for fabricating these devices with self-aligned spacings. In general, the new devices employ multiple trench widths with a self-aligned feature to achieve low specific on-resistance and low gate charge. Various disclosed examples use trenches which (as seen in profile) have three distinct widths, at top, middle, and bottom portions.

Preferably gate and field-plate trenches are etched in the same process sequence, and therefore have the same physical profile. This also provides self-alignment between adjacent trenches of the two types.

The middle portion of the gate trench has generally vertical sidewalls, and includes an insulated gate electrode. The top portion of the gate trench will be wider than the middle portion, and does not have to have vertical sidewalls. The bottom portion of the gate trench is preferably narrower than the middle portion of the same trench. The bottom portion of the field-plate trench is preferably narrower than the middle portion of the same trench. The fabrication process steps of the preferred embodiment result in the same sidewall profile for gate and field-plate trenches (top, middle, and bottom portions). However, as discussed below, some variations of these relations are also contemplated and disclosed.

Figure 1:
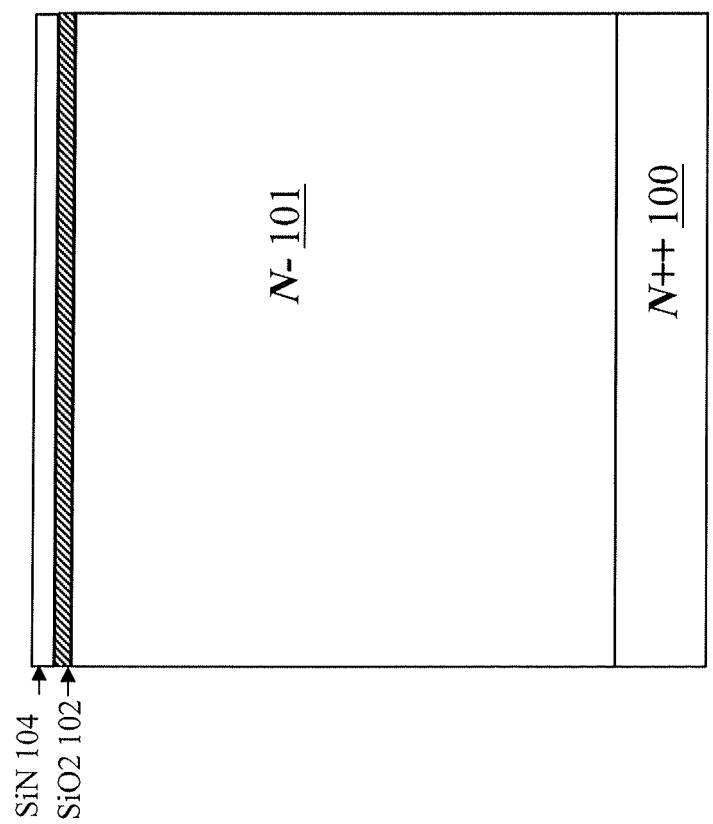

An example of a manufacturing process is described in FIGS. 1-20. As shown in FIG. 1, the starting material (in this example) is an epitaxial structure of n− silicon 101 over an n++ substrate 100. An oxide and nitride composite layer 102/104 is used to form the trench hard mask.

Figure 2:
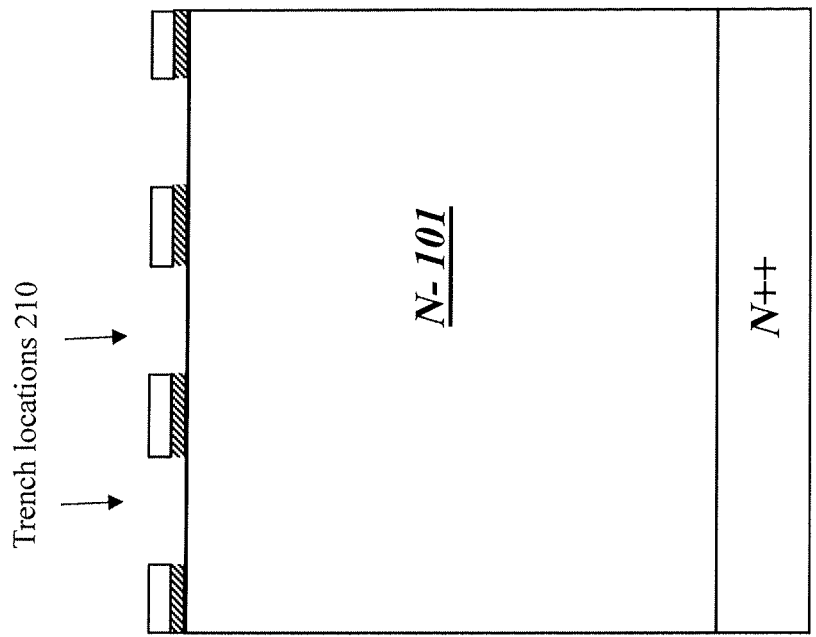

FIG. 2 shows the partially fabricated structure after the hard mask 102/104 has been patterned to expose trench locations 210.

Figure 3:
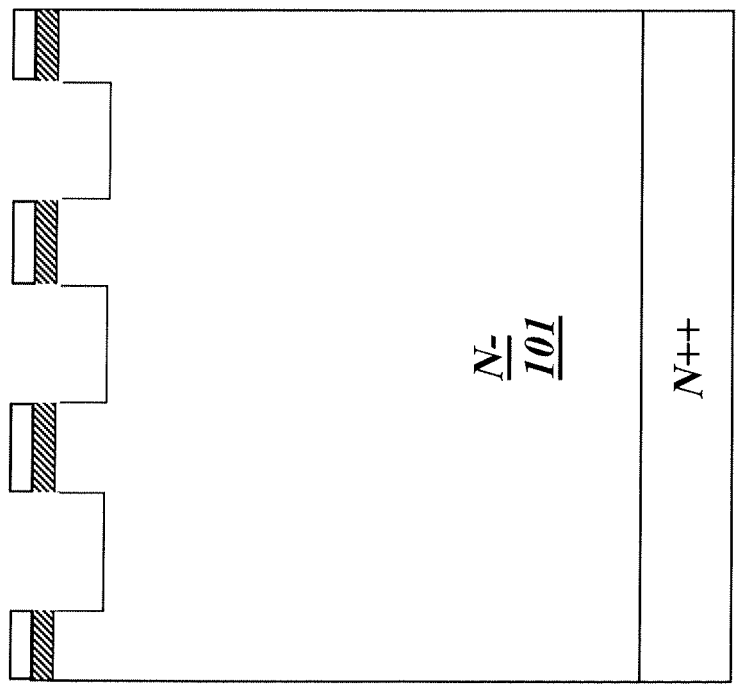
Figure 6:
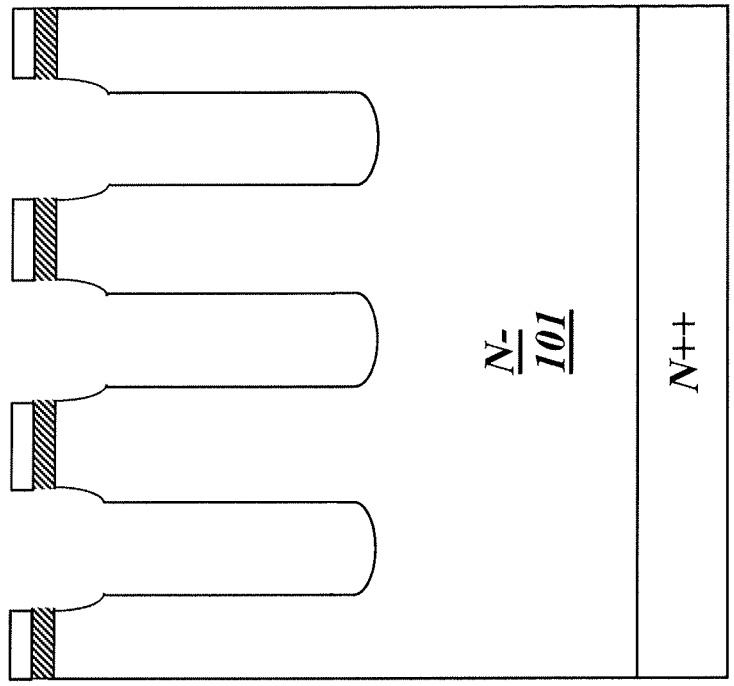

A first trench etch is now performed, as shown in FIG. 3. This etch will control the width of the top portion of the three-part trenches which will ultimately be formed.

Figure 4:
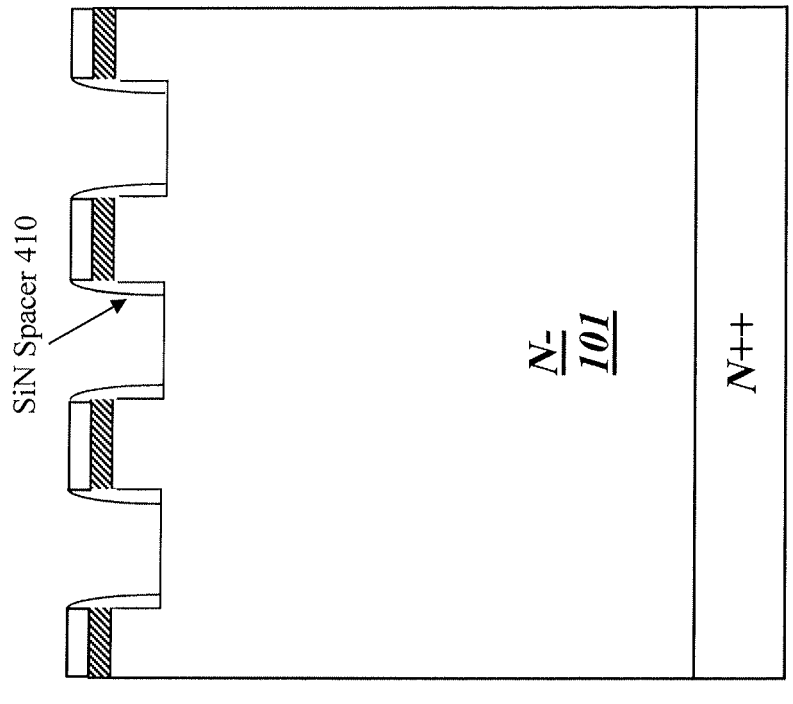

Next, as shown in FIG. 4, a dielectric layer (e.g. $Si_3N_4$, or more generally $SiN_x$) is conformally deposited and anisotropically etched. This creates the "sidewall spacer" structures 410.

Figure 5:
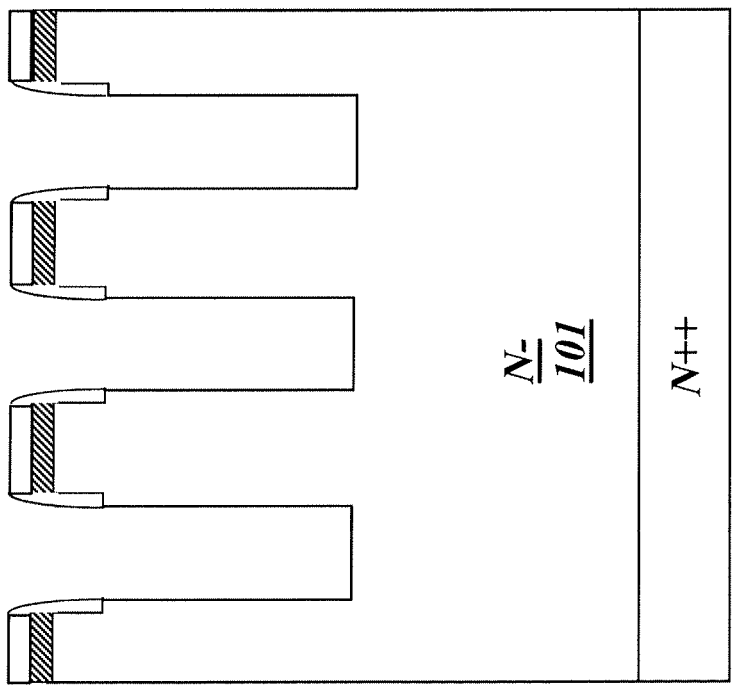

An anisotropic etch of silicon, with selectivity to nitride, is now performed (as shown in FIG. 5).

The spacer 410 is removed, and a sacrificial oxide is grown on exposed silicon, and removed. This smoothes the contours, and results in the partially formed structure of FIG. 6. Since the initial nitride layer 104 is much thicker than sidewall spacers 410, layer 104 will not be removed when sidewall spacers 410 are removed.

A thin "pad oxide" layer (not shown) is now grown, and another sequence of conformal deposition followed by anisotropic etch is performed to leave another sidewall spacer 710. This results in the structure of FIG. 7.

Figure 8:
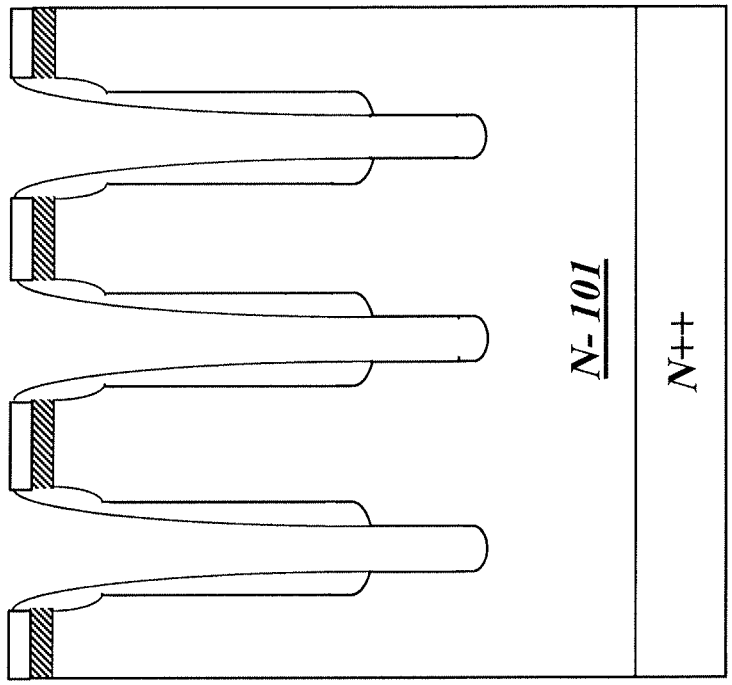
Figure 7:
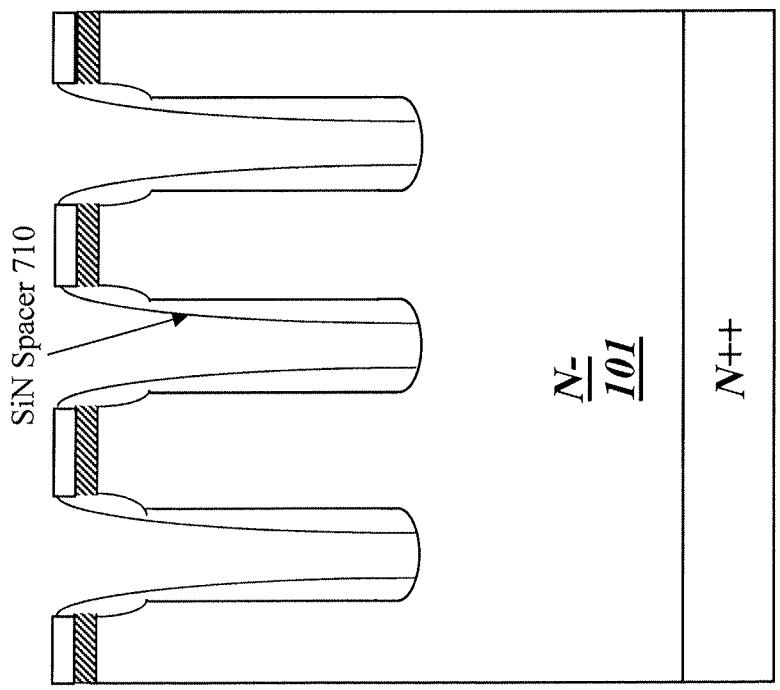
Figure 9:
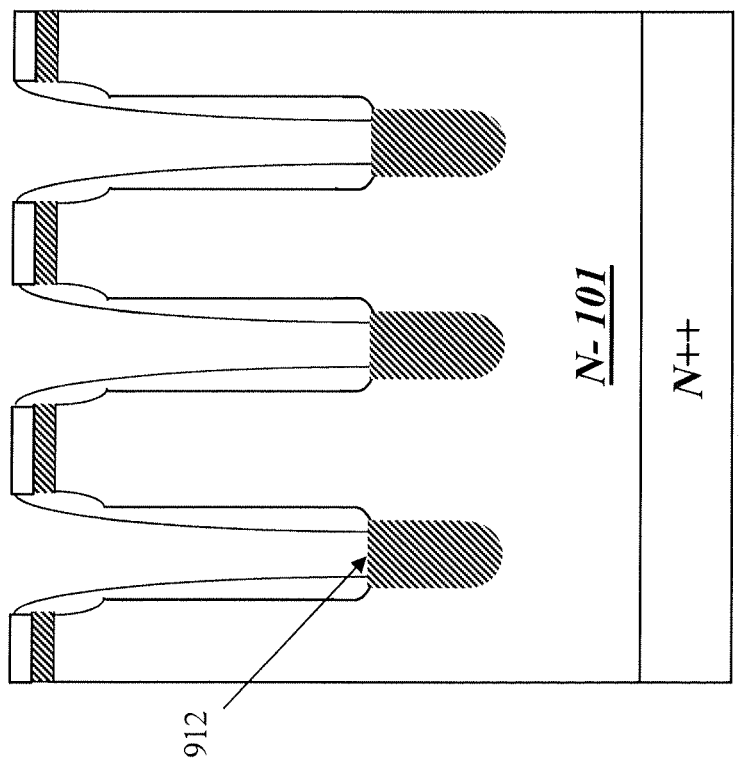

Another silicon etch (selective to nitride) now results in the structure of FIG. 8.

With the pad oxide and silicon nitride stack 710 still in place, an oxidation is now performed to fill the bottom portions of the trenches. This results in the structure of FIG. 9. The top contour of the oxide 912 may vary in dependence on the duration of this oxidation.

Figure 10:
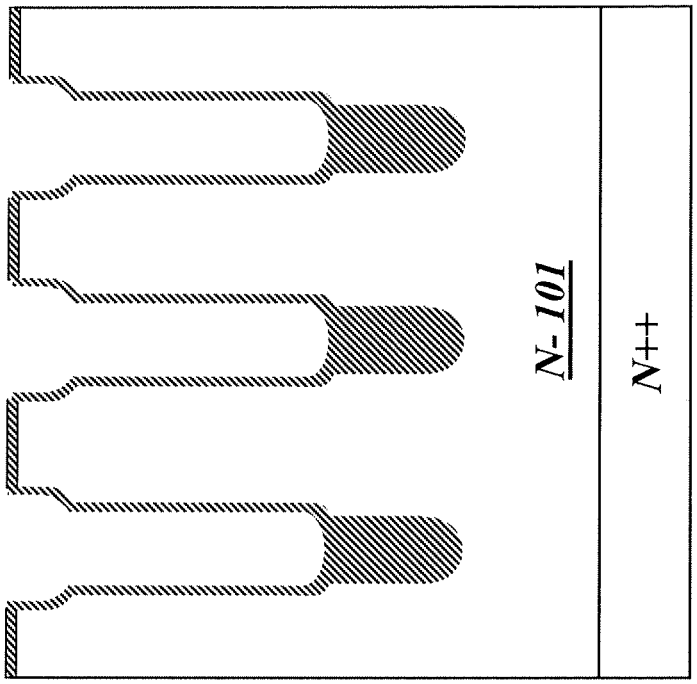

After removal of the SiN spacer 710 and the remaining portions of hard mask 102/104, the structure of FIG. 10 results.

This is now patterned (using photoresist 1105) and etched to leave oxide in the bottom part of first trenches 1110, while removing oxide from second trenches 1120. This results in the structure of FIG. 11. Prior to this point all of the trenches have preferably been the same; after this point the structure of the first trenches 1110 (which will contain insulated trench gates) is different from that of the second trenches 1120 (which will contain field plates).

The photoresist is removed, and a thermal oxidation is taken place to grow a high quality gate oxide 1230 along trench sidewalls, as shown in FIG. 12.

A conductive material (preferably n-type polysilicon) is now deposited overall, and etched back to provide conductive plugs 1310 in all the trenches. This results in the structure of FIG. 13. Note that these plugs 1310 are deeper in the second trenches 1120 (where they extend down into the bottom portion of the trench) than in the first trenches 1110.

Figure 14:
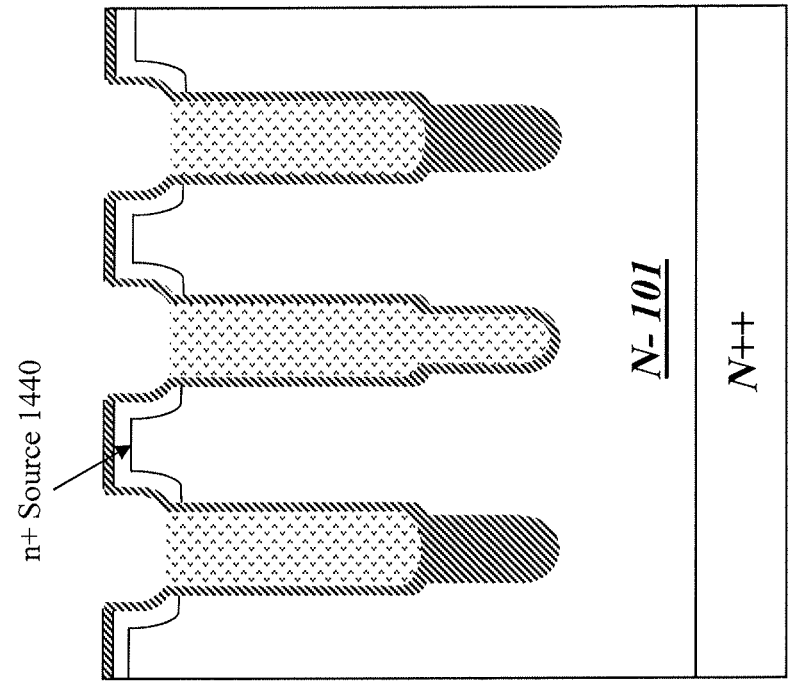
Figure 13:
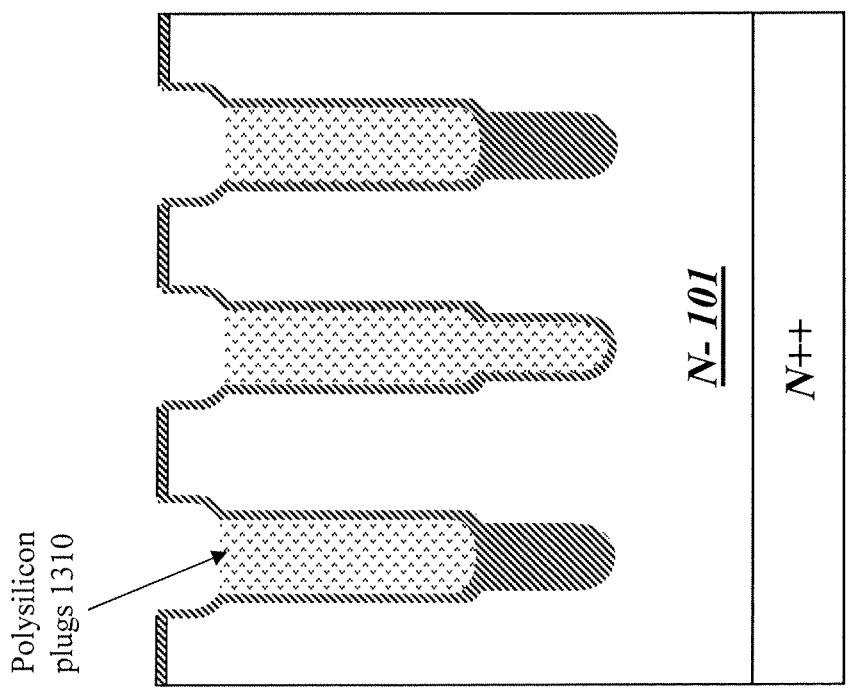

A donor dopant (e.g. arsenic or phosphorus) is implanted into the wafer surface to form the n+ source region 1440 (FIG. 14). Note that the n+ source region 1440 has a non-uniform depth conforming to the depth profile of the top portion of the trenches: source region 1440 is shallower in the mesa areas, and becomes deeper near the trench sidewalls. This is preferably a masked implant, although the relevant mask does not appear in the small active device region shown.

As shown in FIG. 15, another photoresist mask 1505 is used to pattern an etch which etches back the polysilicon plugs 1310, in second trench locations, to leave recessed field plates 1550. (As discussed below, a variety of other process steps can be used to modify this structure if desired.)

After the photoresist 1505 is removed, a p-type dopant, such as Boron, is implanted into the silicon, and a high temperature annealing step is carried out, to form the P-well (body) region 1660 as shown by FIG. 16. Again, as can be seen, the P-well depth is not uniform and is deeper near the trench sidewall due to the existence of the non-uniform implant surface. The deepest portion is located along the trench sidewall of the second trenches 1120. This kind of P-well profile is desirable for improving the device breakdown and ruggedness characteristics, without degrading the on-resistance.

Figure 17:
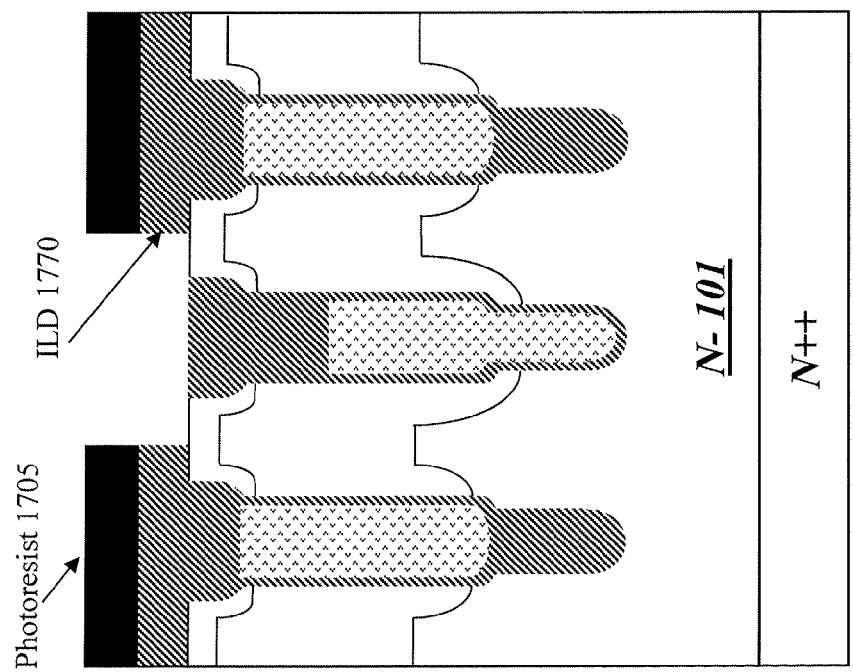

After deposition of an interlevel dielectric ("ILD") layer 1770 (such as BPSG and LTO), photoresist 1705 is patterned to remove the ILD 1770 and open up parts of the n+ source area 1440 (FIG. 17).

Subsequently, the contact silicon recess is produced in a self-aligned manner, by performing a selective etch to form a recess over the field plate 1550. By using an oxide etch which stops on silicon, precise timing and process control is less necessary; this is an improvement over use of a silicon etch as usually done in the conventional trench MOSFET.

Figure 18:
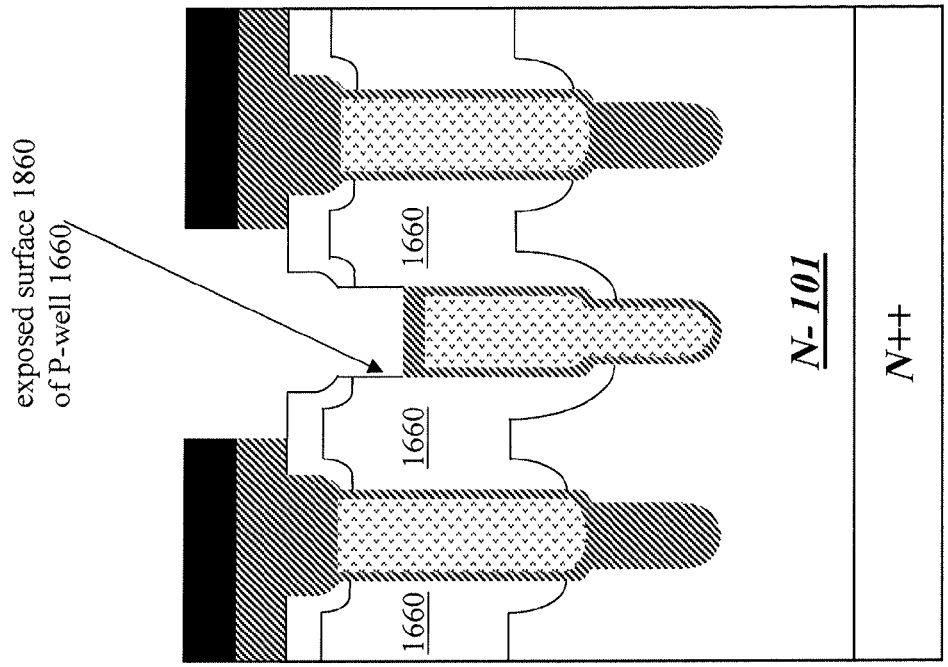

This self-aligned contact recess etch can be followed by a brief reoxidation (or conformal deposition), advantageously resulting in the structure of FIG. 18. Note that, since the top of field plate 1550 is well below the deepest part of source 1440, a significant area 1860 of P-well 1660 is exposed at the sidewalls of second trenches 1120.

Figure 19:
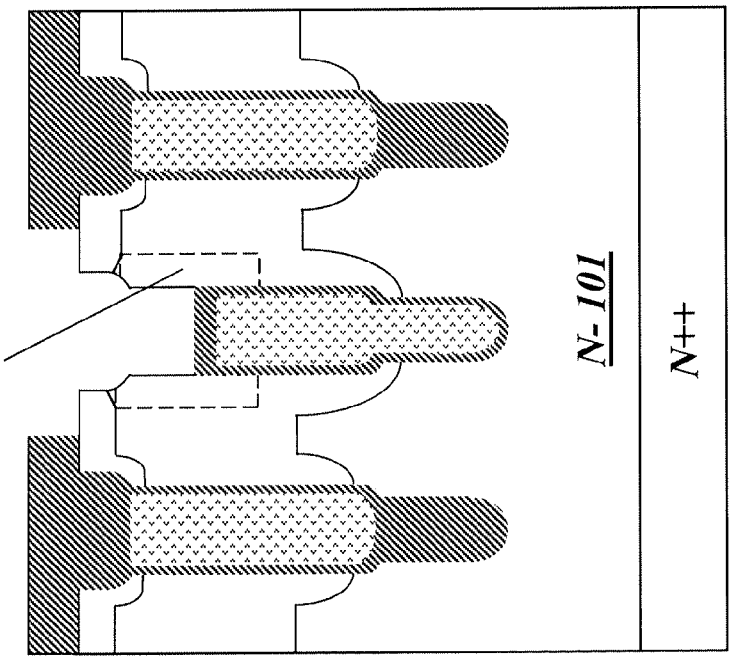

The exposed area of P-well gives room to accommodate the P+ body contact region 1962, and the area where metal makes ohmic contact to P+ region 1962. This is shown in FIG. 19. The P+ body contact region 1962 in FIG. 19 is created by implanting acceptors (such as $BF_2$ and/or $B^{11}$) followed by a high temperature anneal step. The contact area of this P+ region 1962 can be adjusted by properly adjusting the depth of the self-aligned oxide recess during the etchback step of FIG. 15. Moreover, since the acceptor implant which forms P+ regions 1962 has a much smaller implant dose (~1E15/$cm^2$) than the donor implant which forms n+ source regions 1440 (~1E16/$cm^2$), the impact of the P+ implant on the n+ source will be completely compensated inside the n+ source region, leaving the P+ only formed in areas lacking the n+ source dopants, i.e. in the P-well exposed area 1860.

Figure 20:
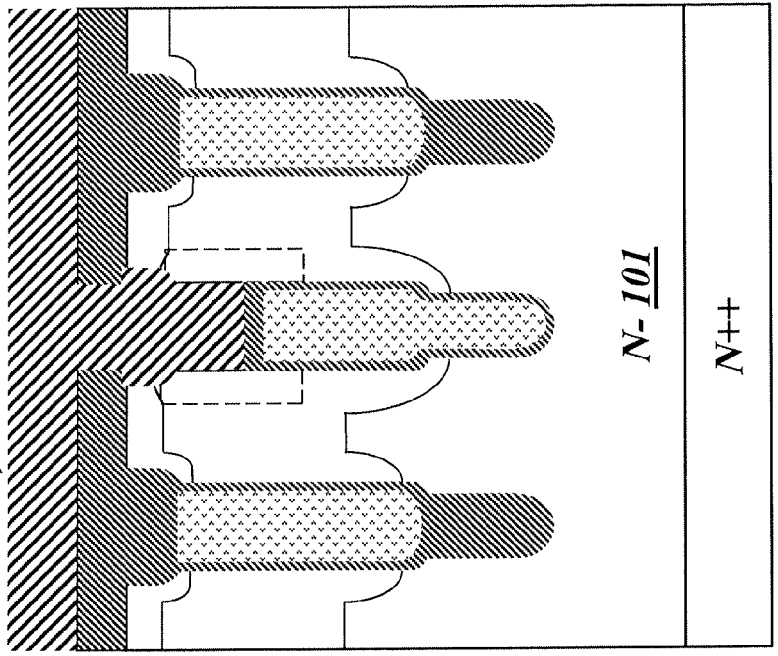

After the source metallization, the n+ source and P+ body regions 1440 and 1660 will be shorted together by the top metal layer 2080 (FIG. 20).

Figure 21:
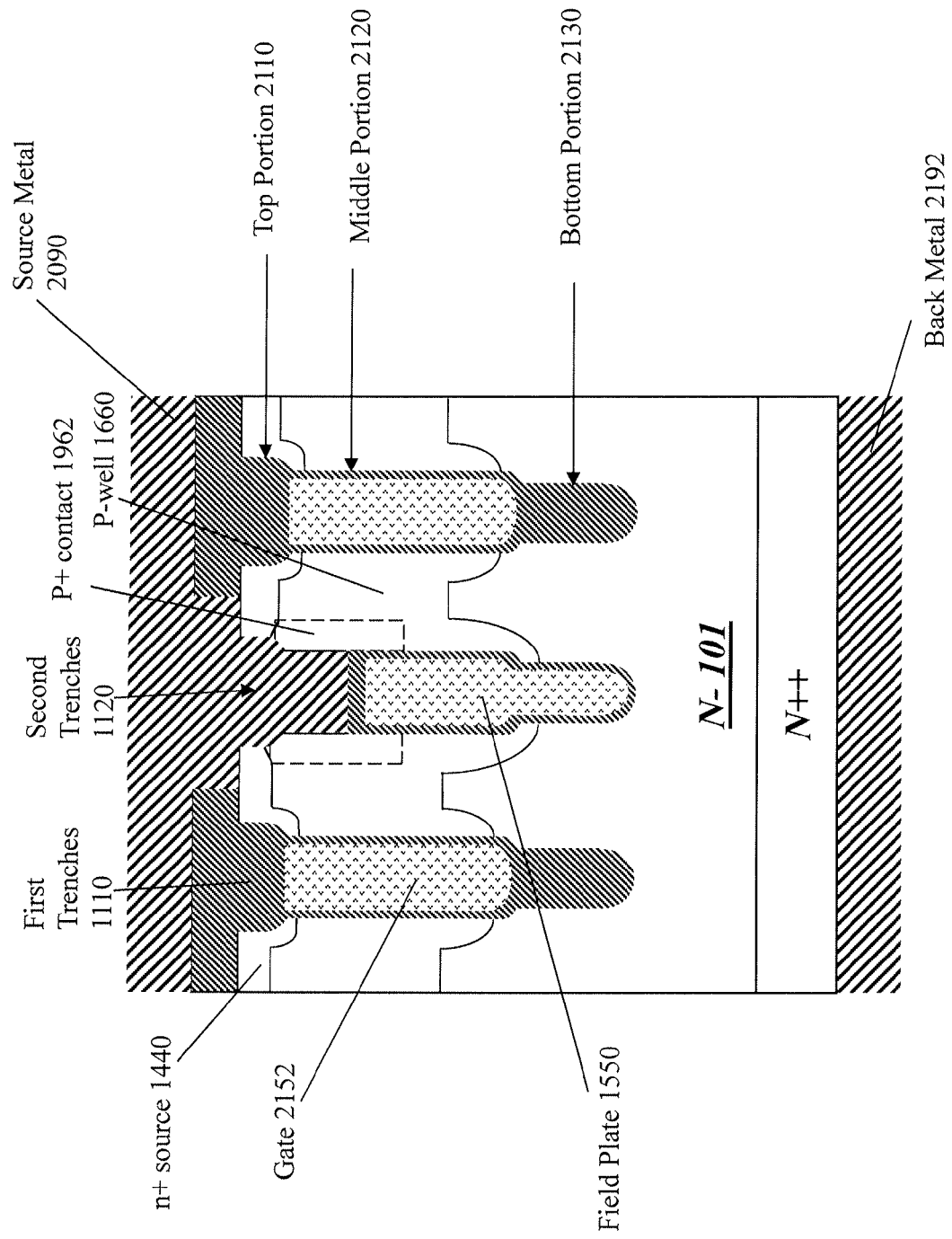
FIG. 21 shows an example of the device structure produced by the steps of FIGS. 1-20.
Figure 26:
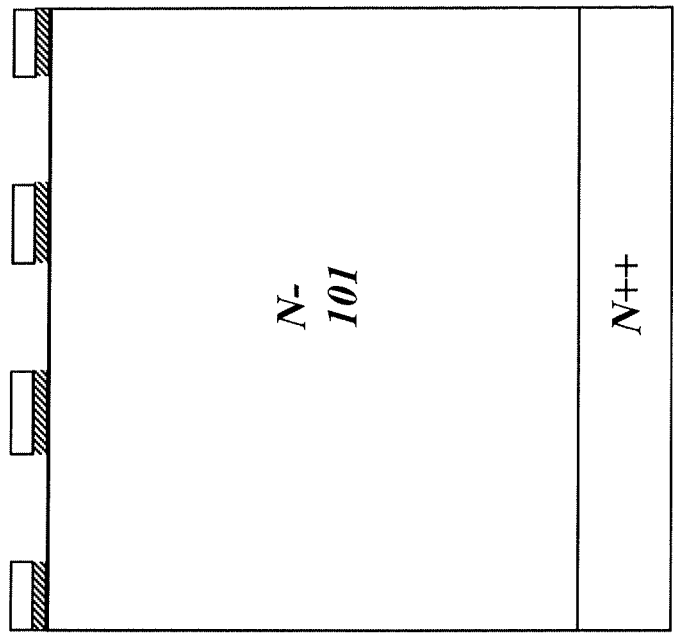
FIGS. 25 to 44 show successive steps in a second example of a manufacturing process which implements many disclosed innovations.
Figure 25:
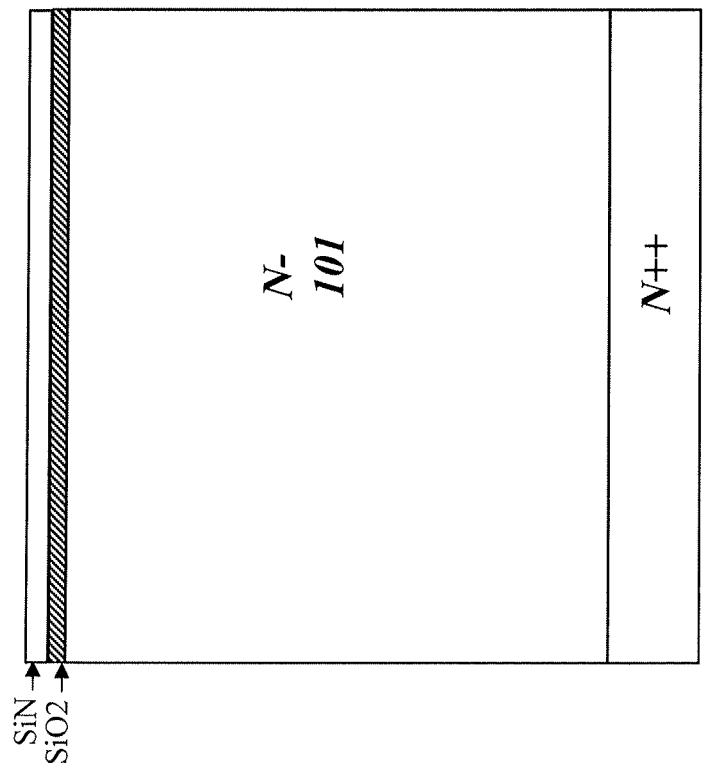
Figure 28:
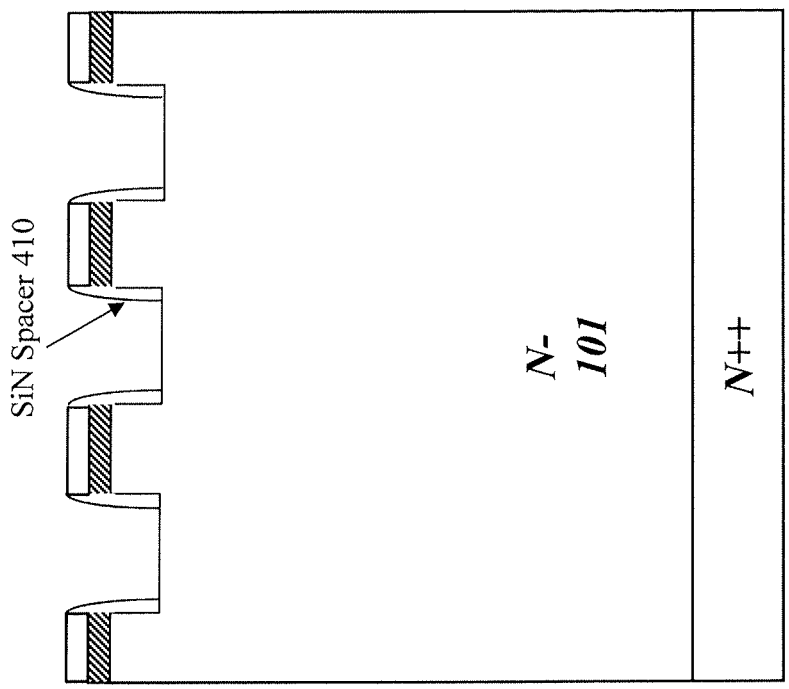
Figure 27:
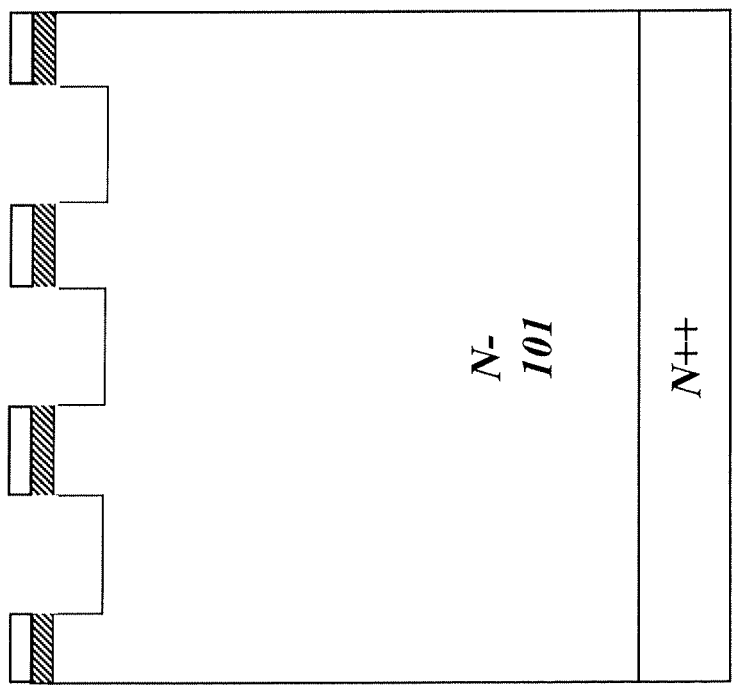

With completion of backside grind and deposition of backside metal 2101, the final device structure is produced as given in FIG. 21. Note that, although the structures inside the first and second trenches are different, the profiles of the two types of trenches are the same: each has a top portion 2110, a middle portion 2120, and a bottom portion 2130. Note also that the middle portions have essentially vertical sidewalls. The bottom portions, in this example, have generally vertical sidewalls except at their bottom corners. Note also that the top portions have less depth than the middle portion. The bottom portions also preferably have less depth than the middle portions in this example, but this will be somewhat affected by the operating voltage specification of the device. The first trenches 1110 each include a gate electrode 2152, which can be modified as described below. This gate electrode will normally be connected to a gate drive connection outside the plane of the device cross-section shown here. The second trenches 1120 each include a field plate 1550, which can be connected (outside the plane of the device cross-section shown here) to source potential. Alternatively, the field plate electrode 1550 can be connected to a different fixed potential, or to a variable potential which is affected by gate voltage, or even (less preferably) left floating.

The drawings described above are sketches which show the expected spatial relationships resulting from the process flow as described. In addition, a two-dimensional process simulation has been run on the process flow described above. FIG.

22 shows the final device structure, and internal doping profiles, corresponding to the sequence of FIGS. 1-21.

In practice, an important measure of the manufacturability of a semiconductor process flow is its sensitivity to misalignments. To measure this with the above flow, the impact of contact misalignment on P+ body and n+ source has been simulated, and the results are presented in FIG. 23. This clearly shows that even with 70 nm misalignment, the P+ body and n+ source profile are very similar, and, more important, the misalignment has little impact on the channel doping profile (thanks to the self-aligned contact silicon recess and the non-uniform depth of the n+ source). In consequence, this misalignment has little impact on device electrical parameters including the threshold voltage $V_{TH}$ and the specific on-resistance $R_{SP}$ as well as the breakdown voltage BVDSS.

Additionally, as mentioned in previous paragraph, the unique P-well profile helps to improve the breakdown characteristic of the device. This is clearly verified by the simulated potential contours at the onset of the device breakdown, as shown in FIG. 24. It can be seen that the deep portion of the P-well pushes much of the voltage drop down into the epitaxial layer, and limits the isopotential lines from extending into the channel region, thus leading to a reduction of the device leakage current.

The above simulations used the example of a 30V-rated device with a pitch of 1.4 micron. Actual device breakdown was found to occur at about 33 Volts. The on-state specific resistivity was found to be 8.77 mΩ.mm². These are good numbers for a low-voltage power device.

A further improvement of the devices and processes described above can be achieved by the forming the so-called charge balanced EPI layer of the device. This can be accomplished by introducing couple additional implants at different process points.

FIGS. 25 to 44 describe one sample implementation of this improvement. This process sequence is generally very similar to that of FIGS. 1-20, except as noted.

FIGS. 25, 26, 27, and 28 are generally identical to FIGS. 1-4.

Figure 29:
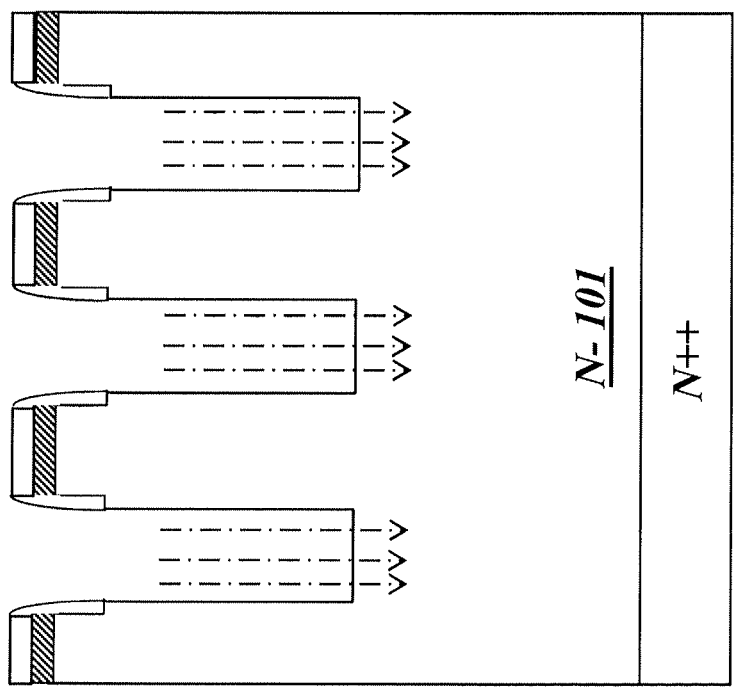

FIG. 29 shows how, after the 2nd trench etch, donor atoms (e.g. phosphorus, arsenic, or a combination of the two) is introduced by implant to locally adjust the doping concentration inside the EPI layer at the first depth.

Figure 30:
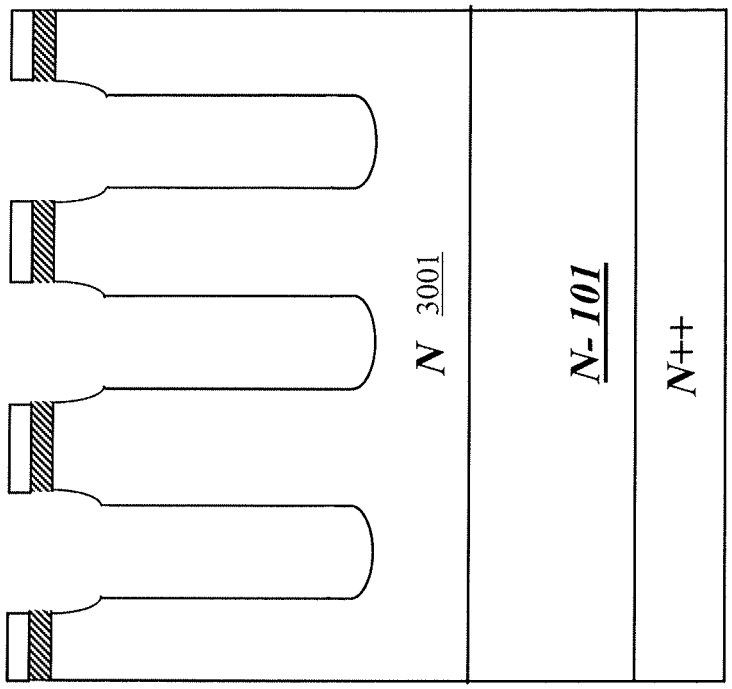

As shown in FIG. 30, this results in an enhanced donor concentration in regions 3001, above the rest of epitaxial layer 101.

Figure 31:
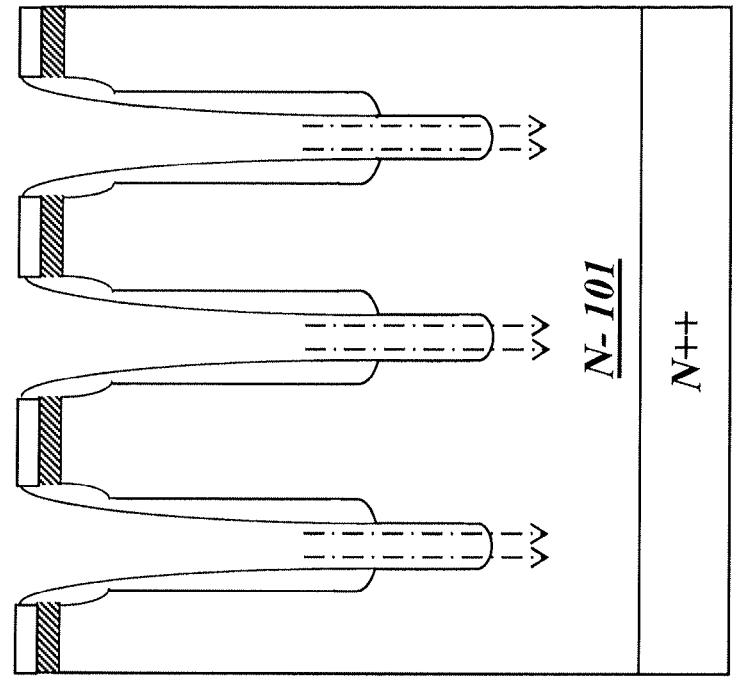
Figure 32:
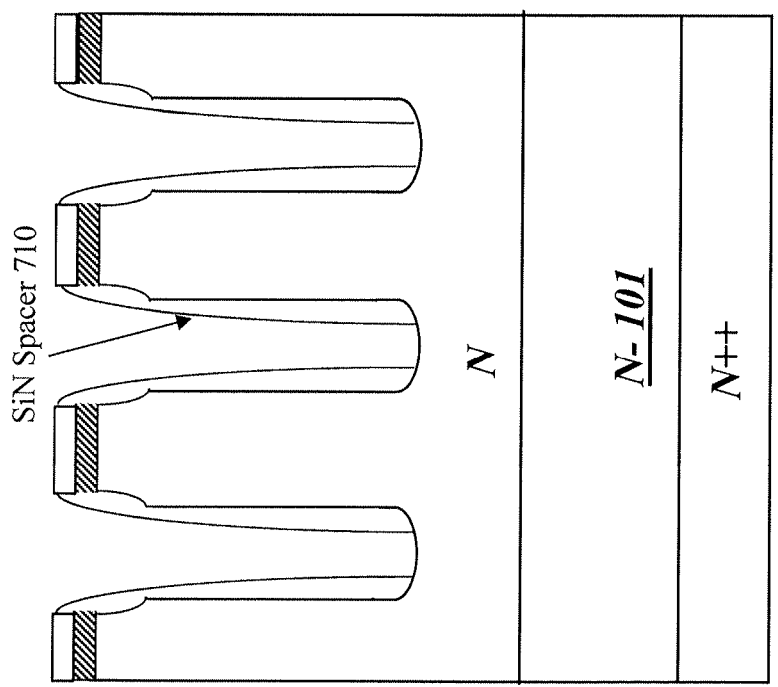

FIG. 31 and FIG. 32 are generally similar to the corresponding figures in the first process flow, except that an additional N-type doping concentration enhancement at the 2nd depth is done after the 3rd trench etch, e.g. by phosphorous or arsenic implantation through the bottoms of the trenches.

Figure 33:
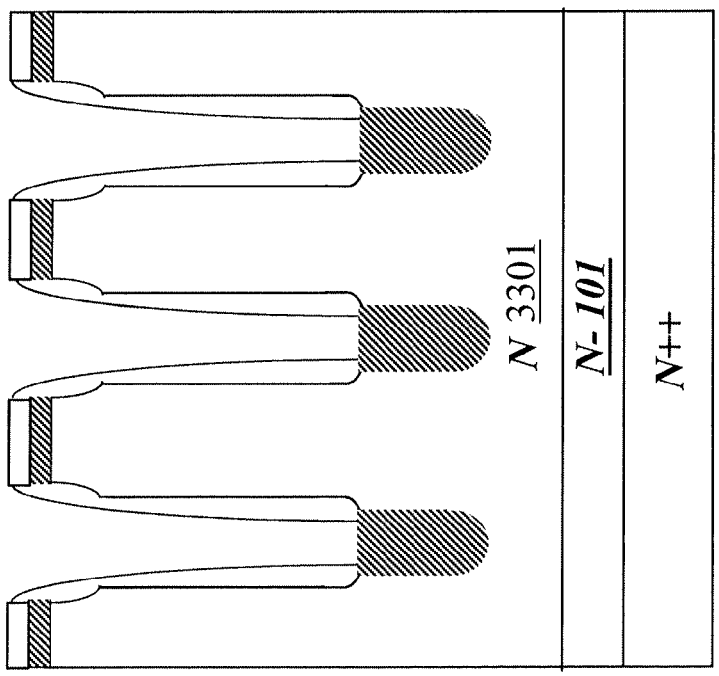

After this process step, as shown in FIG. 33, the doping in region 3301 is highly enhanced, and this reduces the resistance of the drift region. (Region 3001 is omitted for simplicity in this drawing, since regions 3001 and 3301 are not sharply distinct.)

Figure 34:
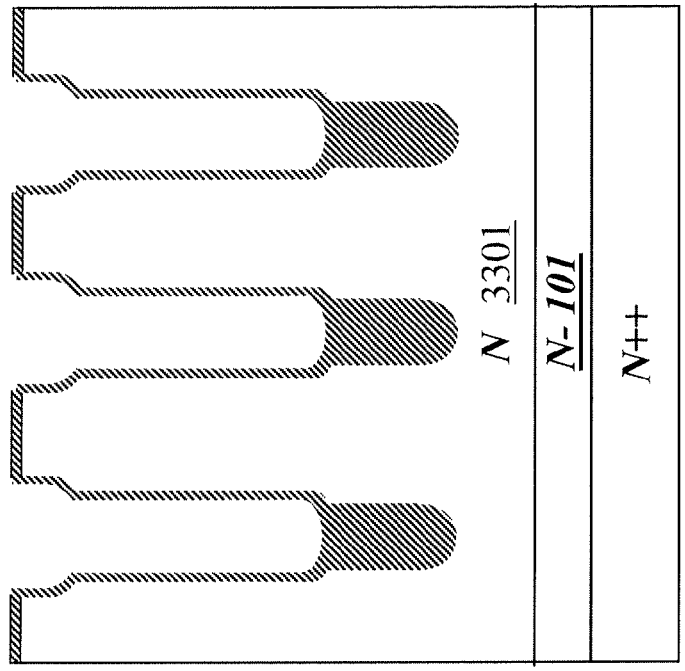

FIG. 34 shows further processing, which corresponds to that shown in FIG. 10 above.

The additional doping in region 3301, by itself, would tend to degrade the device breakdown voltage. In order to eliminate this negative impact, the P-type dopant Boron is implanted into the EPI in FIG. 35 after the removal of buried oxide ("BOX") layer 912. By properly choosing the implant doses, a charge balanced EPI layer can be formed and the device breakdown voltage will not decrease with the increased conductivity due to doping enhancement 3301. Therefore, the improved device will have a lower on-resistance for a given breakdown voltage.

Figure 36:
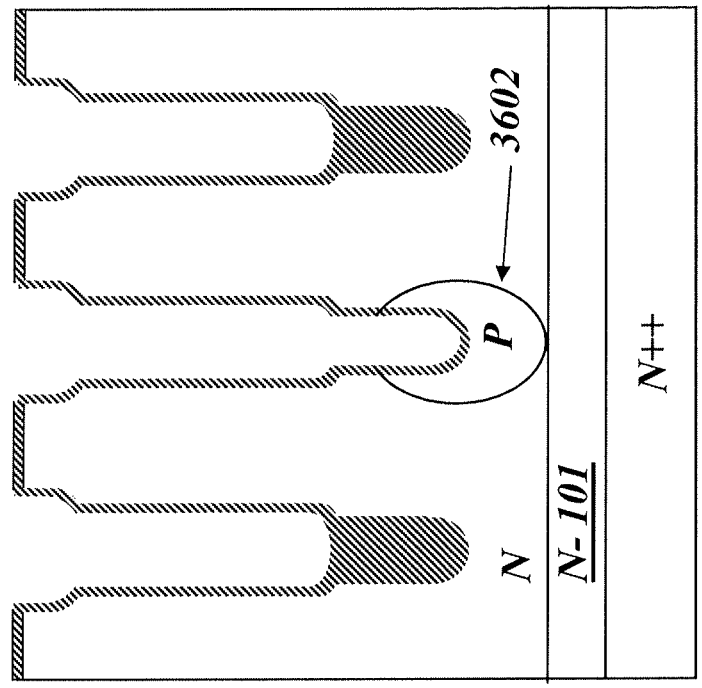
Figure 35:
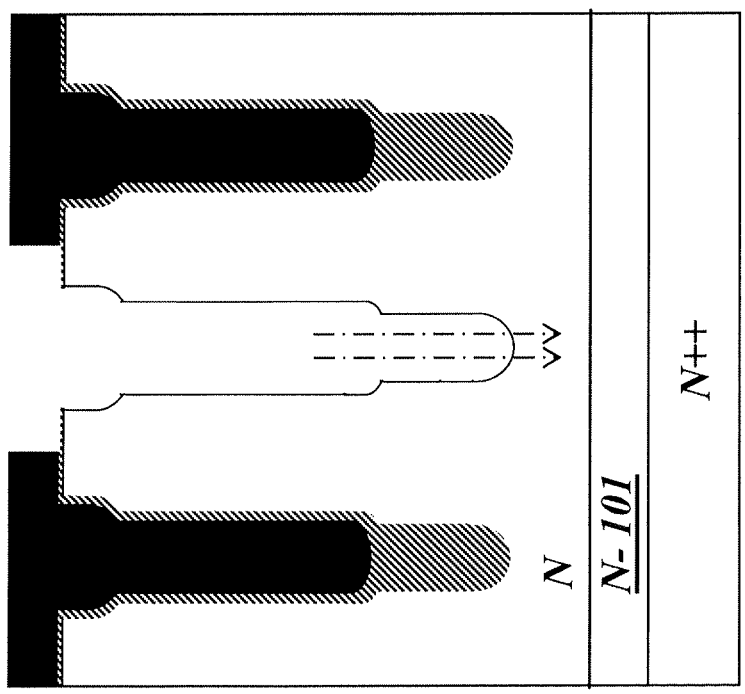
Figure 38:
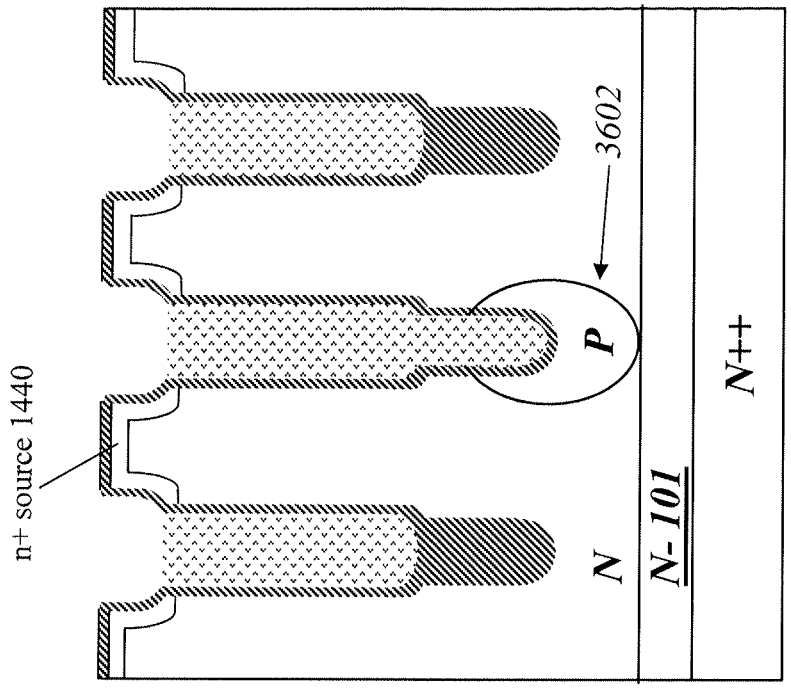
Figure 37:
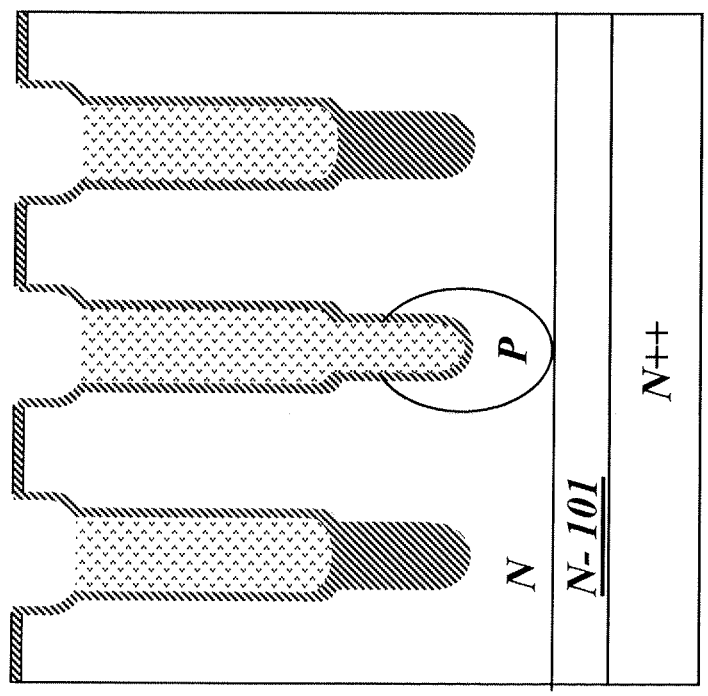
Figure 40:
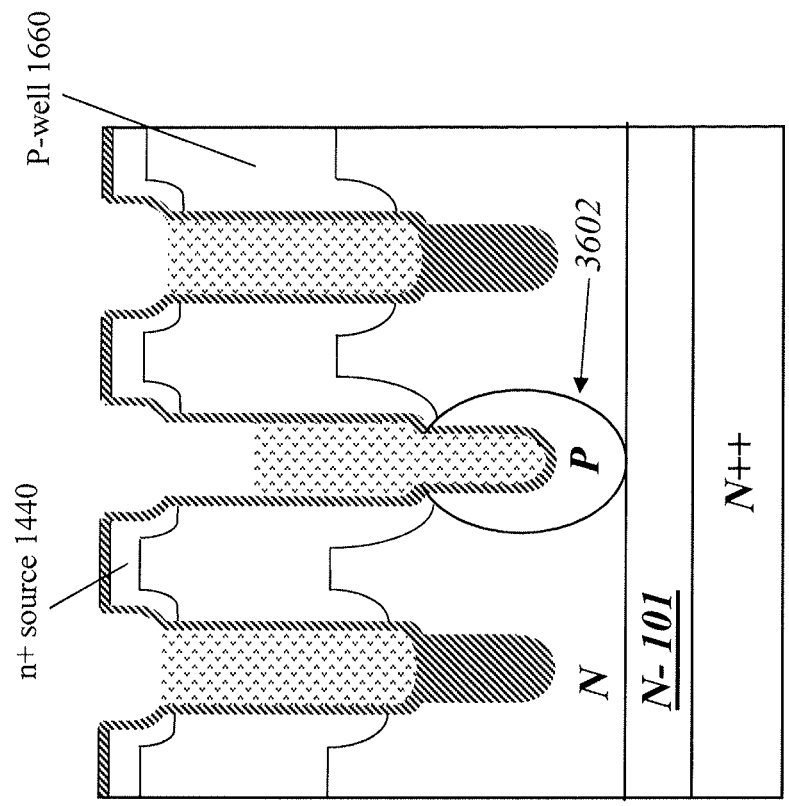
Figure 39:
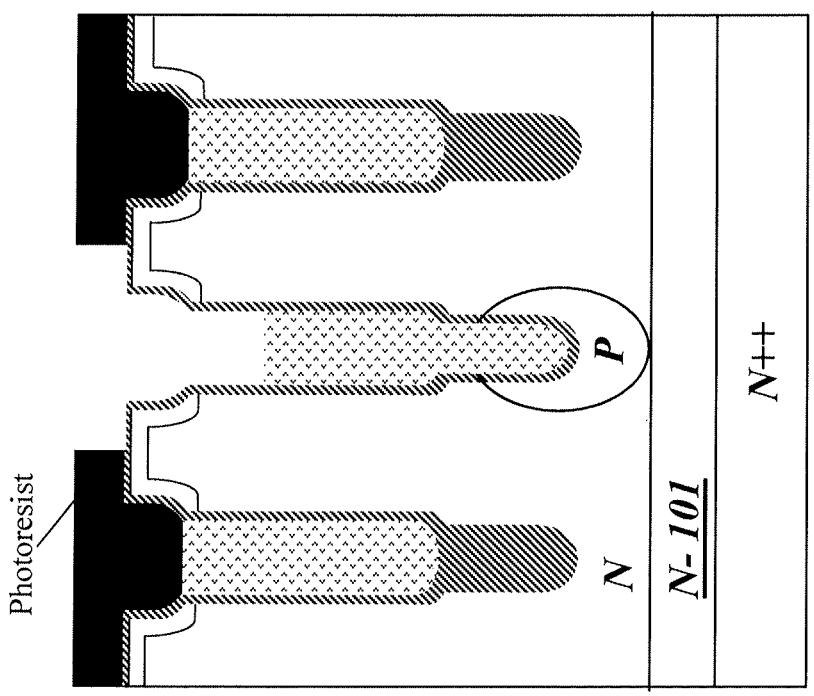
Figure 42:
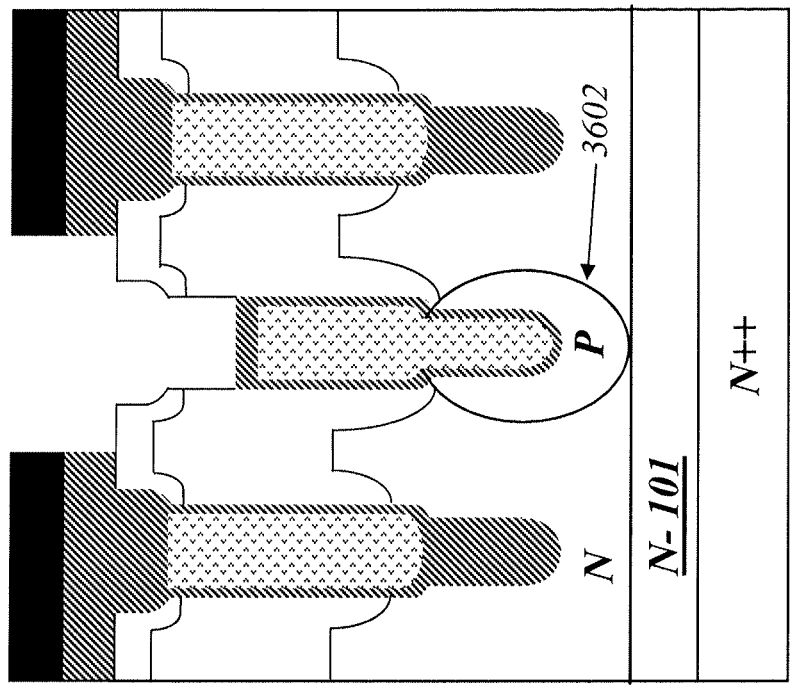
Figure 41:
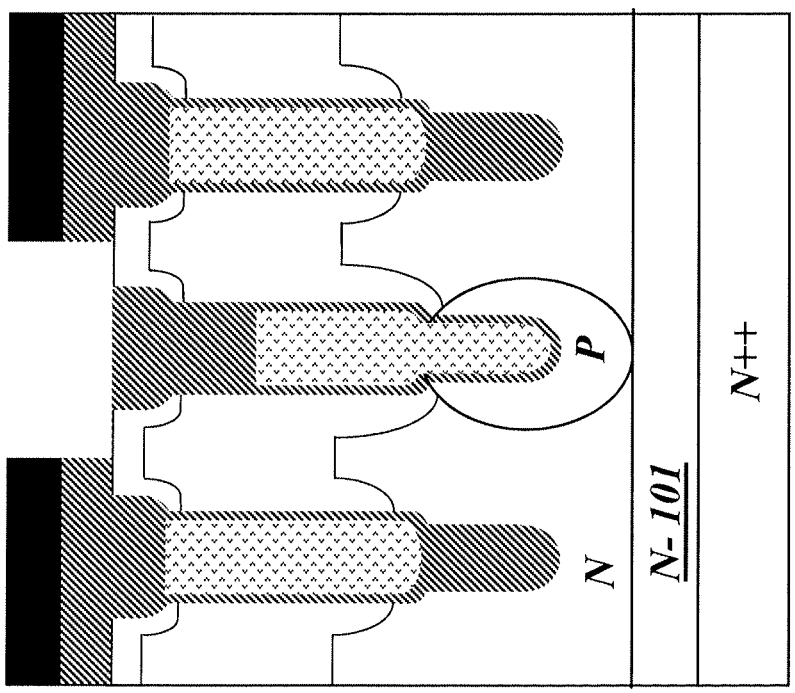
Figure 44:
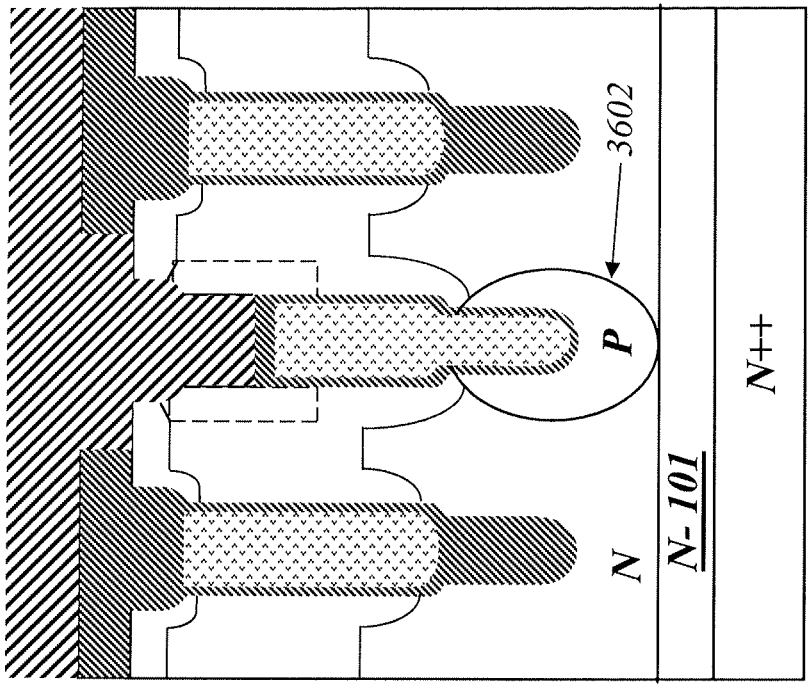
Figure 43:
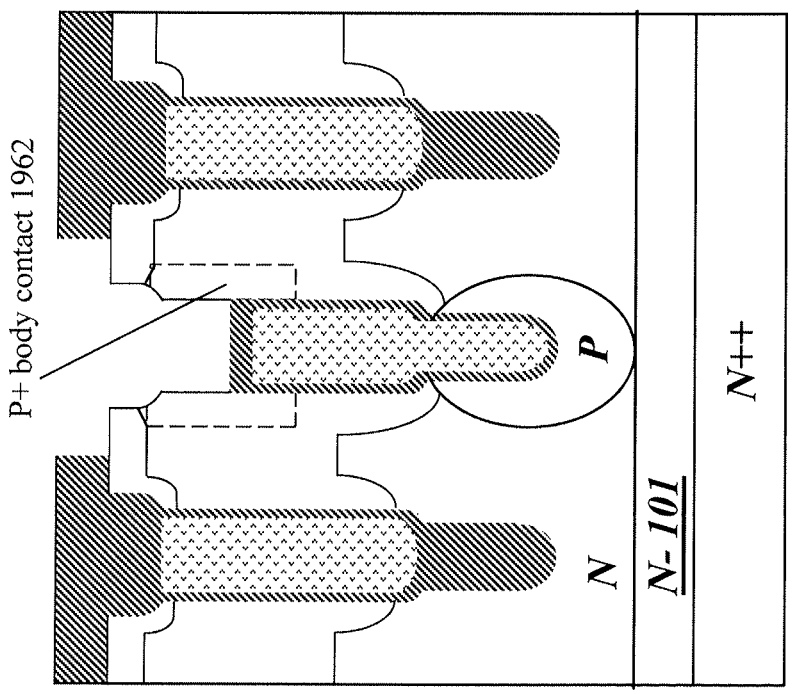

The implant step of FIG. 35 results in a p-type shield region 3602, as shown in FIG. 36. This provides the advantages just described.

The remaining process steps, successively shown in FIG. 37, FIG. 38, FIG. 39, FIG. 40, FIG. 41, FIG. 42, FIG. 43, and FIG. 44, are generally the same as those shown in FIGS. 13-20 and described above. The final device structure is depicted in FIG. 45.

In another class of alternative implementations, the contact self-aligned silicon etch is performed by employing the oxide-filled 1st trench as the mask, without using the additional photoresist mask. This is illustrated in FIG. 46. The space between the contact edge and the sidewall channel inside the 2nd trench can be adjusted by changing the width of the 1st trench. The implementation of this scheme is briefly demonstrated through FIG. 46, FIG. 47, and FIG. 48. In this sequence, a trench MOSFET with a thick BOX layer and an optimized P-well junction profile is used as the example. Note that the p+ region 4762, which makes ohmic contact from the p-well 1660 to the front metal, is formed differently from the p+ body contact region 1962 which is shown in FIG. 19 and following.

The concepts disclosed in this application are not limited to the examples discussed in the paragraphs above. They can be used for developing many different device structures such as the devices illustrated in FIG. 49A and following Figures.

Figure 45:
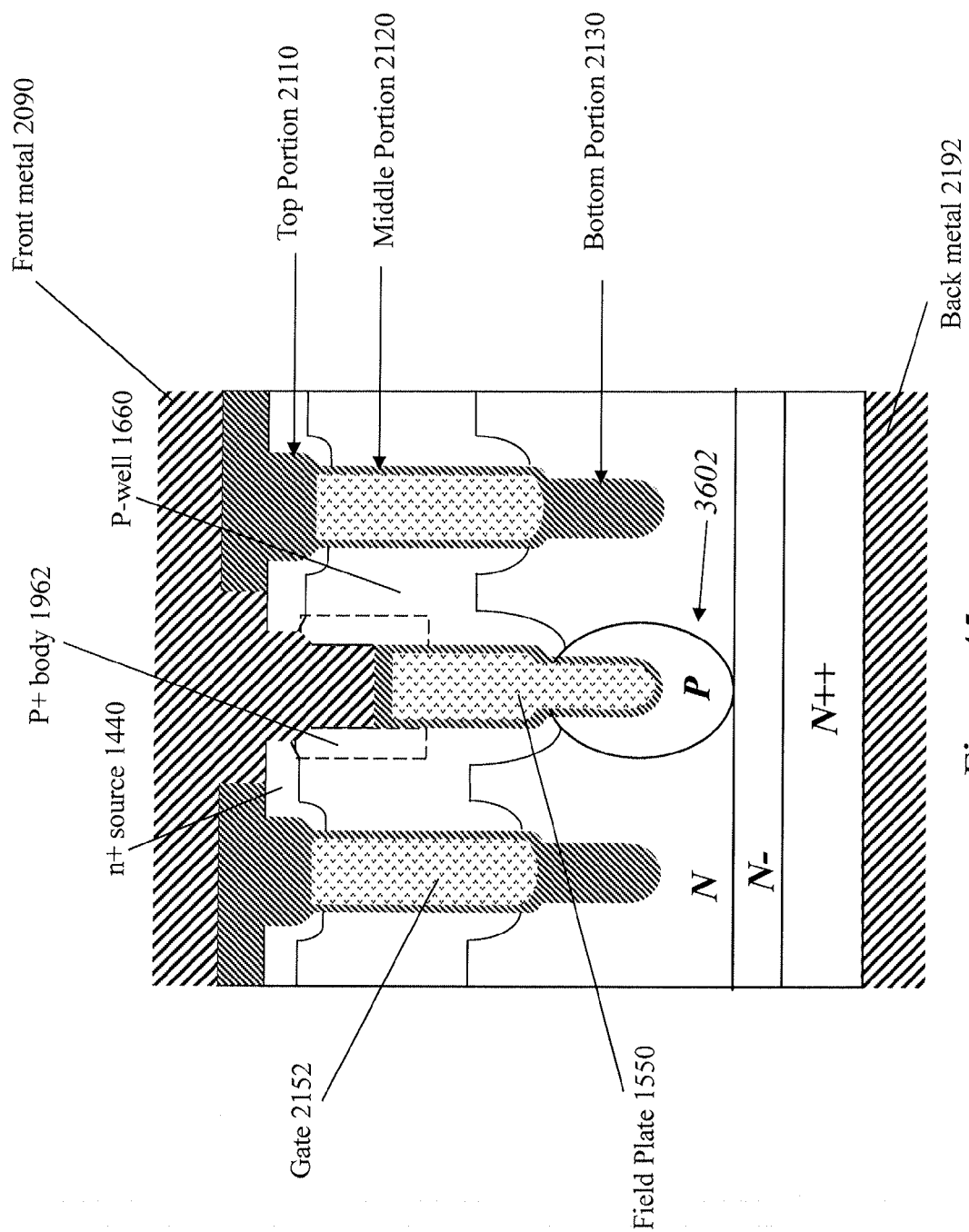
FIG. 45 shows an example of the device structure produced by the steps of FIGS. 25-44.
Figure 48:
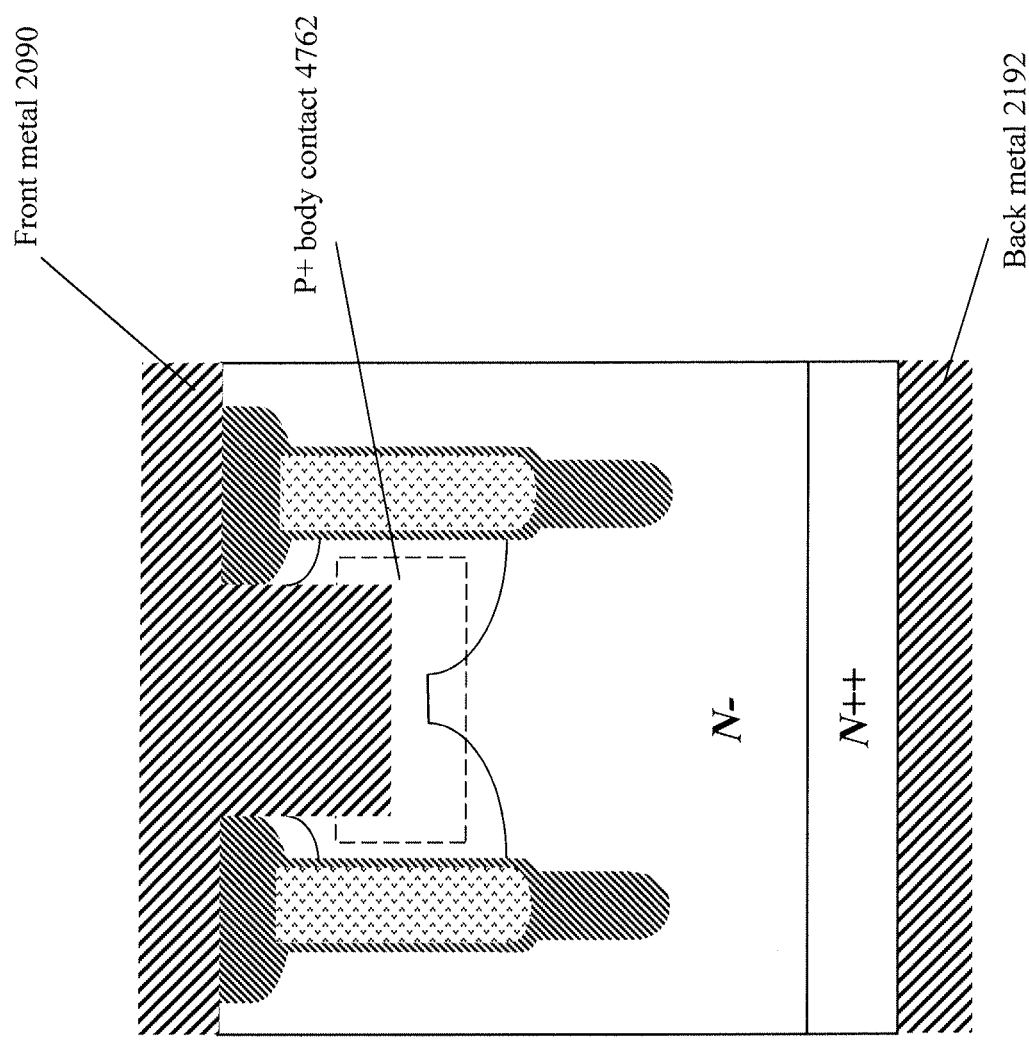
Figure 49A:
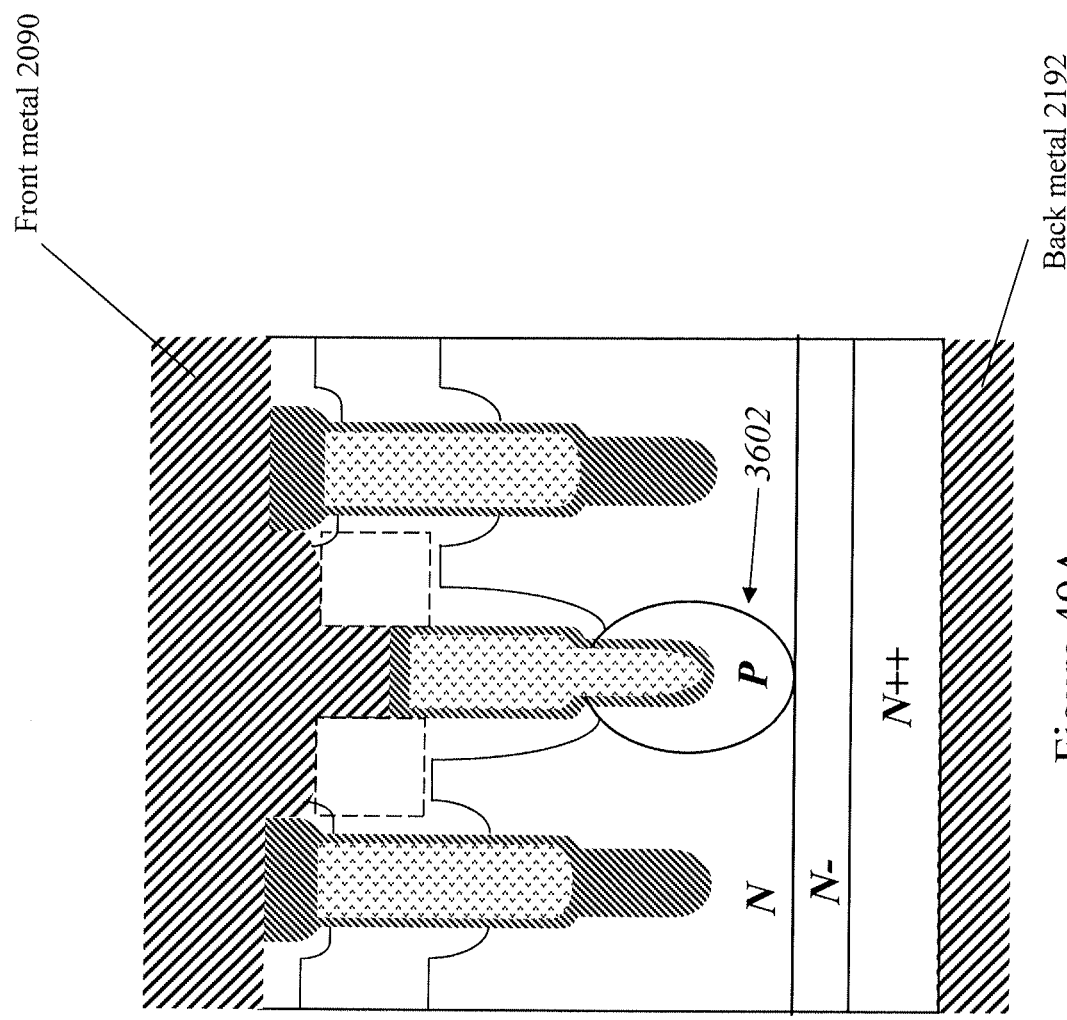
FIG. 49A shows a different example of a device structure which provides another implementation of various innovative concepts.

FIG. 49A shows a device structure which is generally somewhat similar to that of FIG. 45, except that the modified process steps of FIGS. 46-48 have been used.

Figure 49B:
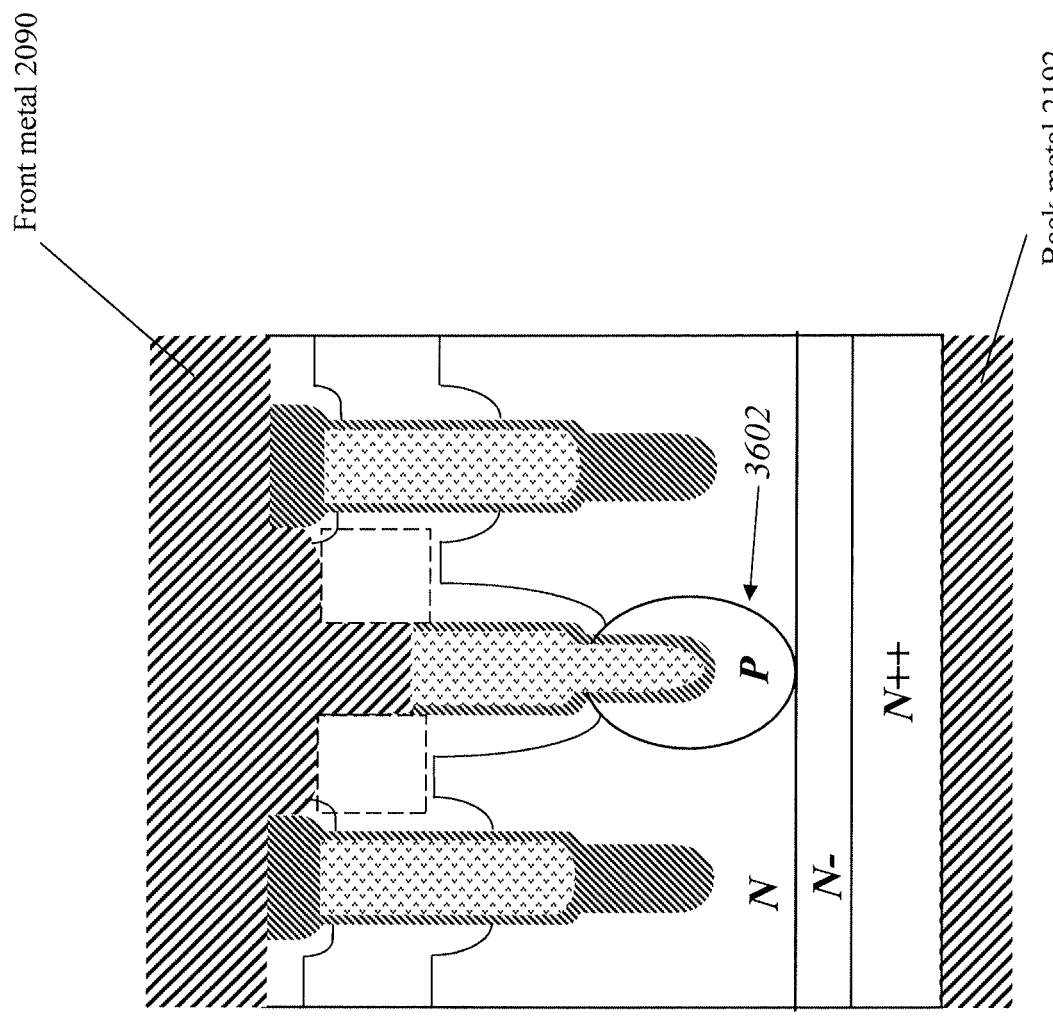
FIG. 49B shows yet another variation on various of the disclosed innovative concepts.

FIG. 49B shows a device structure which is generally somewhat similar to that of FIG. 49A, except that in FIG. 49B there is not any oxide layer between source metal and field plate electrode (at the location shown). In FIG. 49B the source metal is in direct contact with the field plate electrode.

Figure 50:
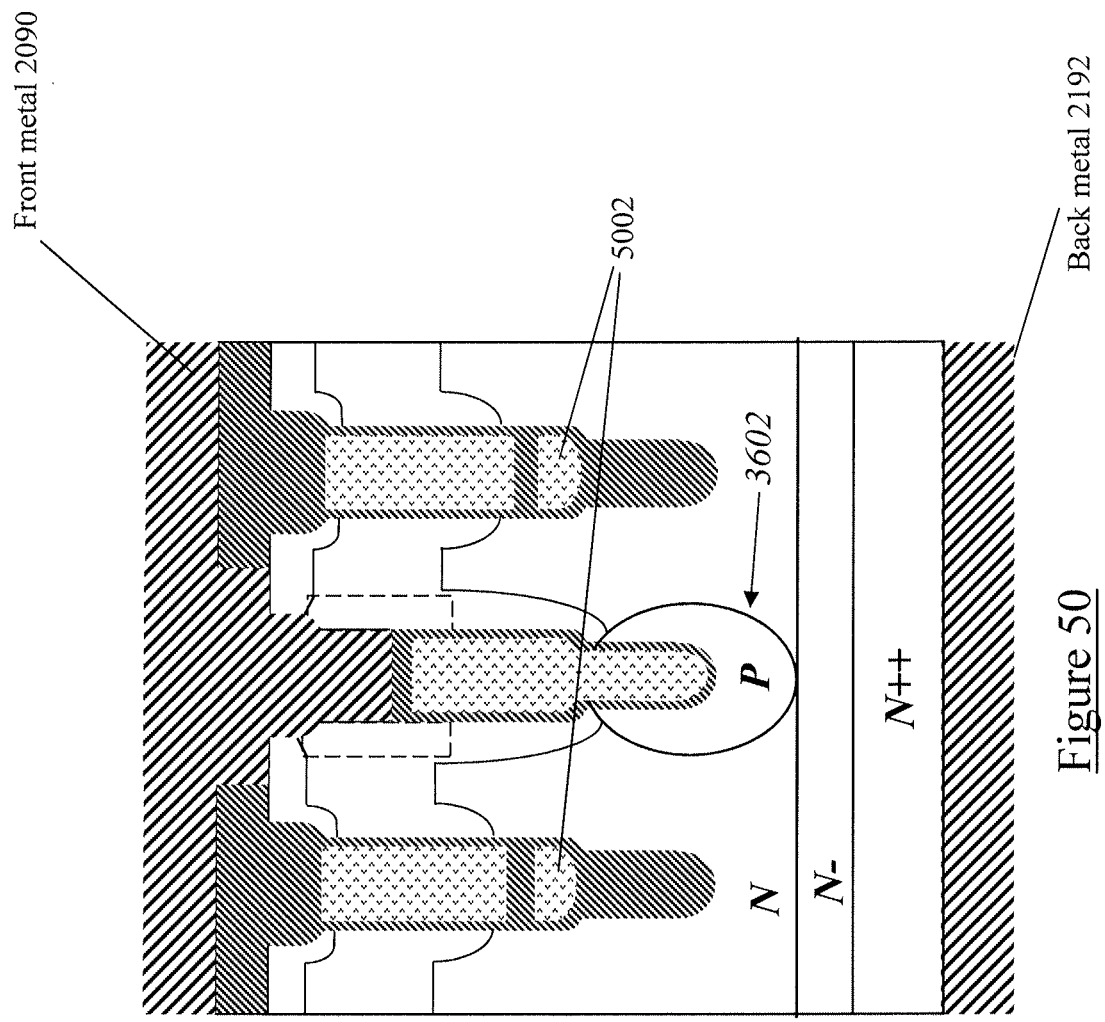
FIG. 50 shows yet another variation on various of the disclosed innovative concepts.

FIG. 50 shows a device structure which is generally somewhat similar to that of FIG. 21, except that a shield electrode 5002 is present below the gate electrode in the first trenches. This advantageously reduces gate-drain parasitic capacitance.

Figure 51A:
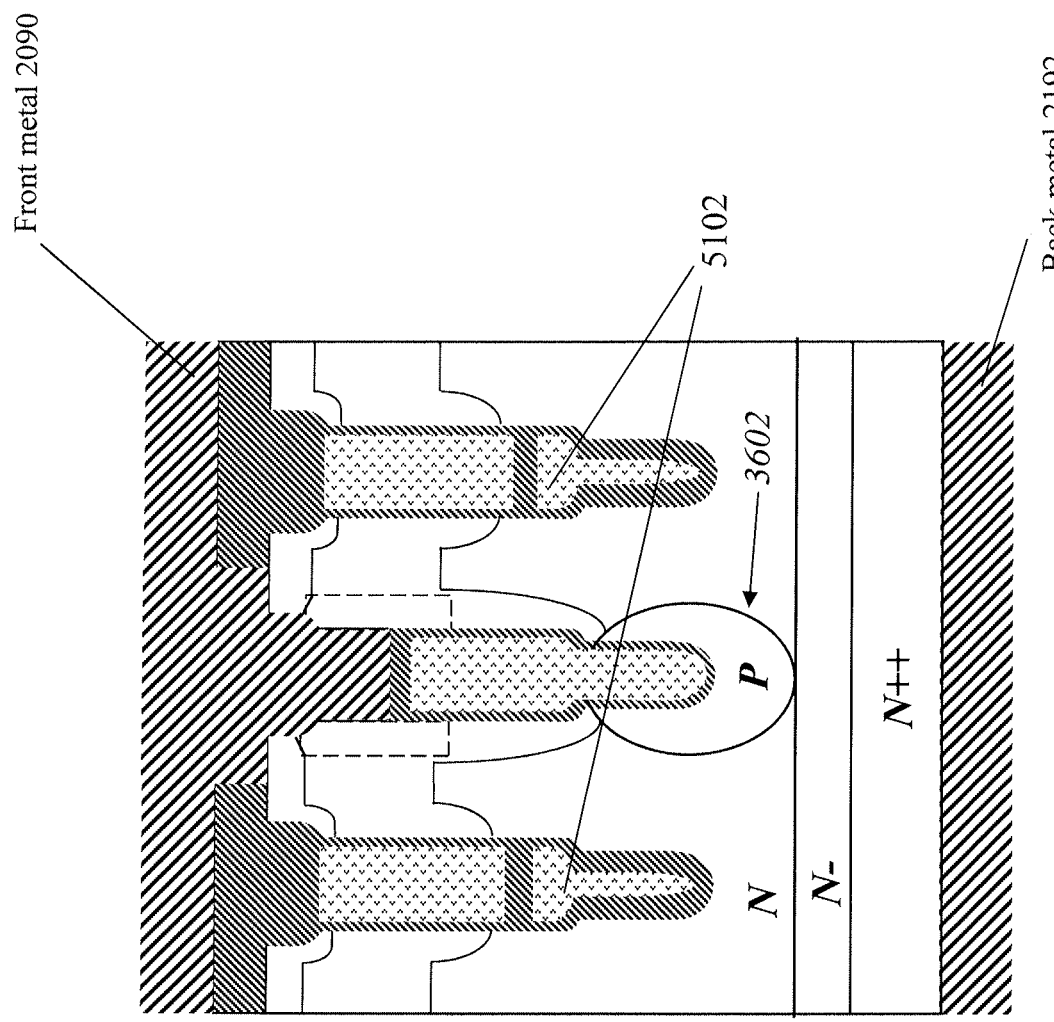
FIG. 51A shows yet another variation on various of the disclosed innovative concepts.

FIG. 51A shows a device structure which is generally somewhat similar to that of FIG. 21, except that a shield electrode 5102 is present below the gate electrode in the first trenches. The shield electrode is preferably connected to the source electrode at certain places in the device (not shown). This too advantageously reduces gate-drain parasitic capacitance.

Figure 51B:
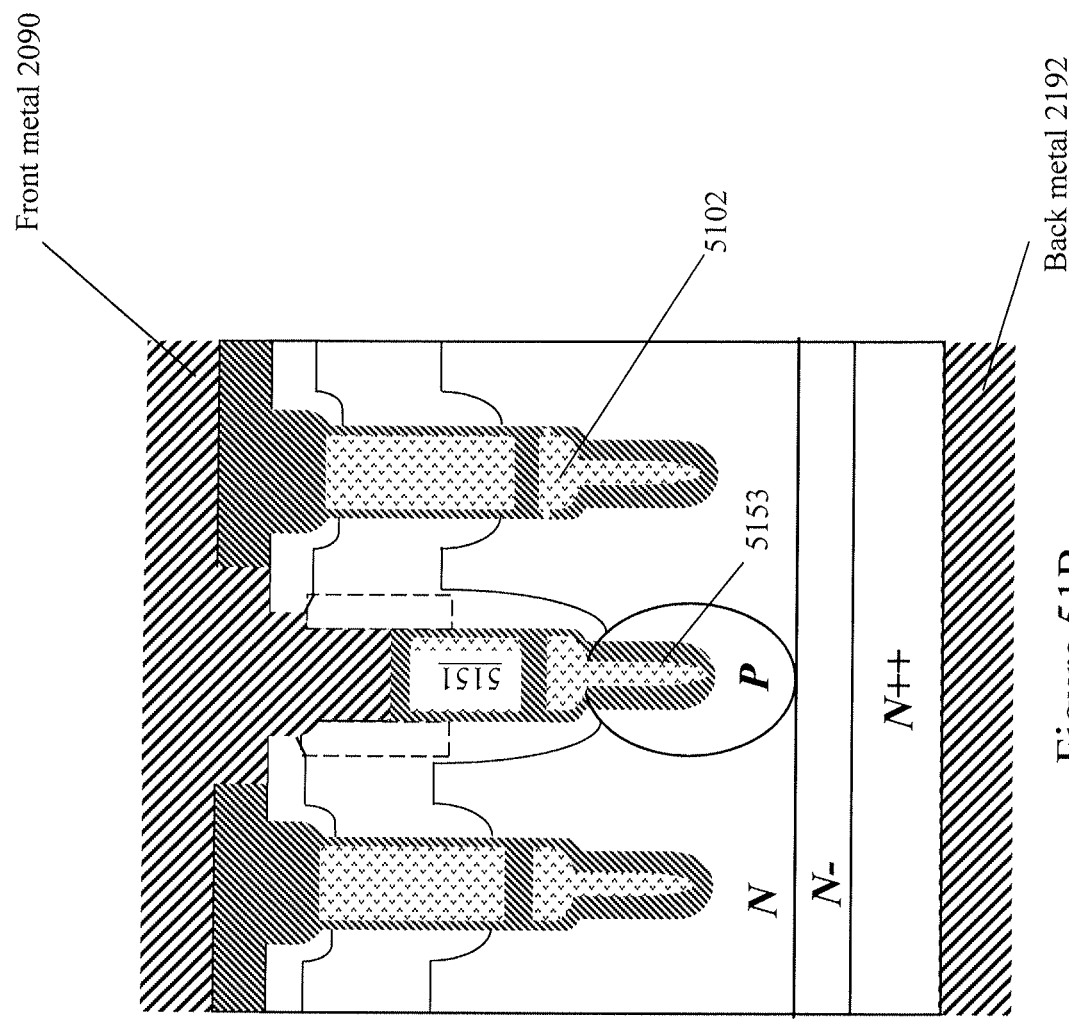
FIG. 51B shows yet another variation on various of the disclosed innovative concepts.

FIG. 51B shows a device structure which is generally somewhat similar to that of FIG. 21, except that a shield electrode 5102 is present below the gate electrode in the first trenches, and the field plate has been split into an upper part 5151 and a lower part 5153.

Figure 52:
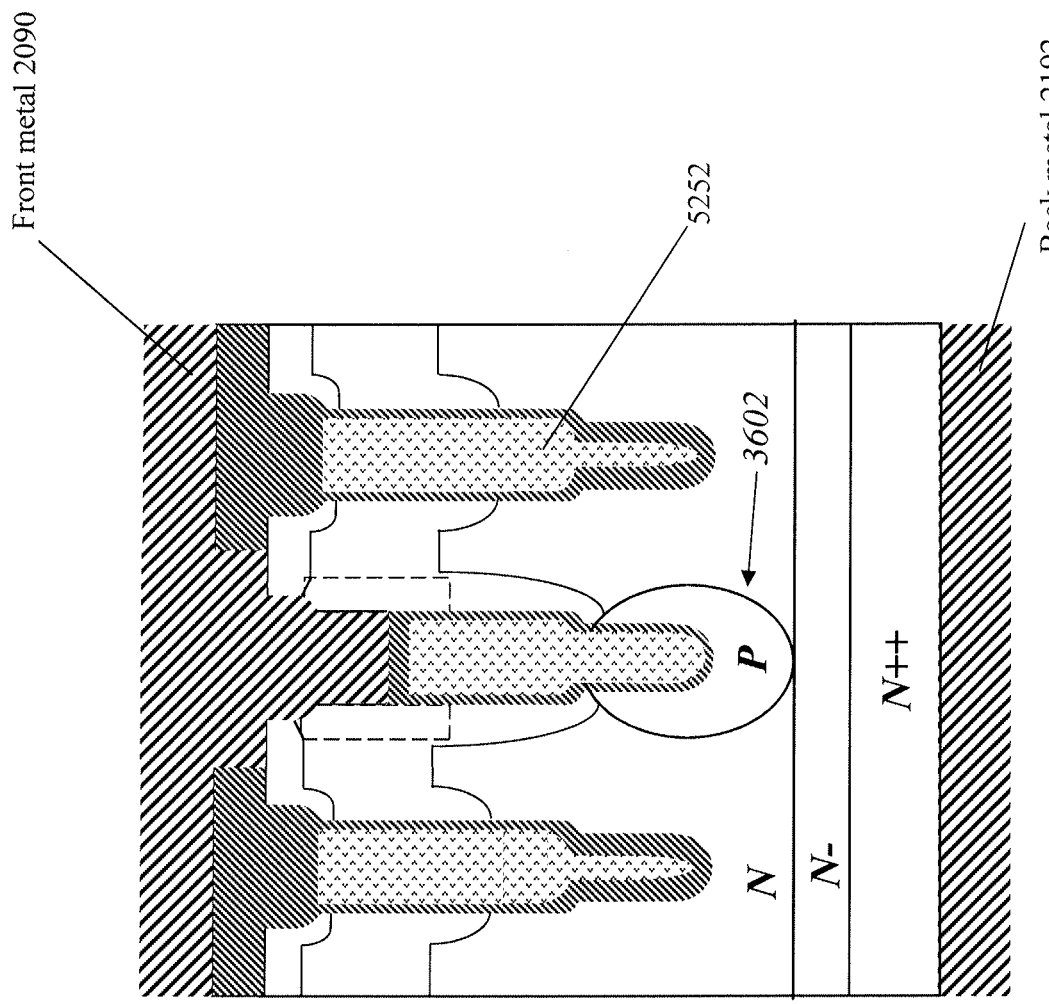
FIG. 52 shows yet another variation on various of the disclosed innovative concepts.

FIG. 52 shows a device structure which is generally somewhat similar to that of FIG. 45, except that the gate electrode 5252 has a lower extension surrounded by thick insulation.

Figure 53:
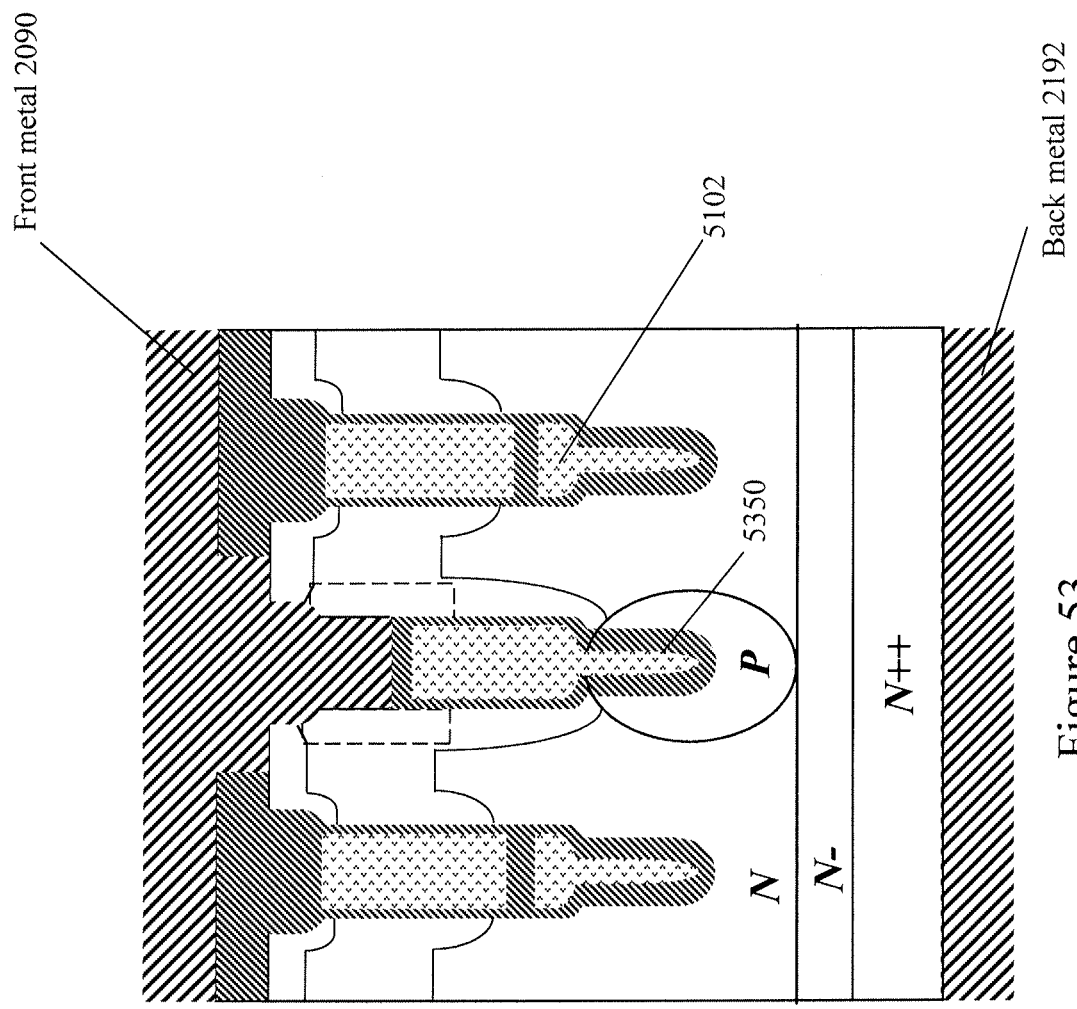
FIG. 53 shows yet another variation on various of the disclosed innovative concepts.

FIG. 53 shows a device structure which combines the modifications of FIGS. 51A and 52, and also includes a field plate electrode 5350 which has a lower extension surrounded by thick insulation.

Figure 54:
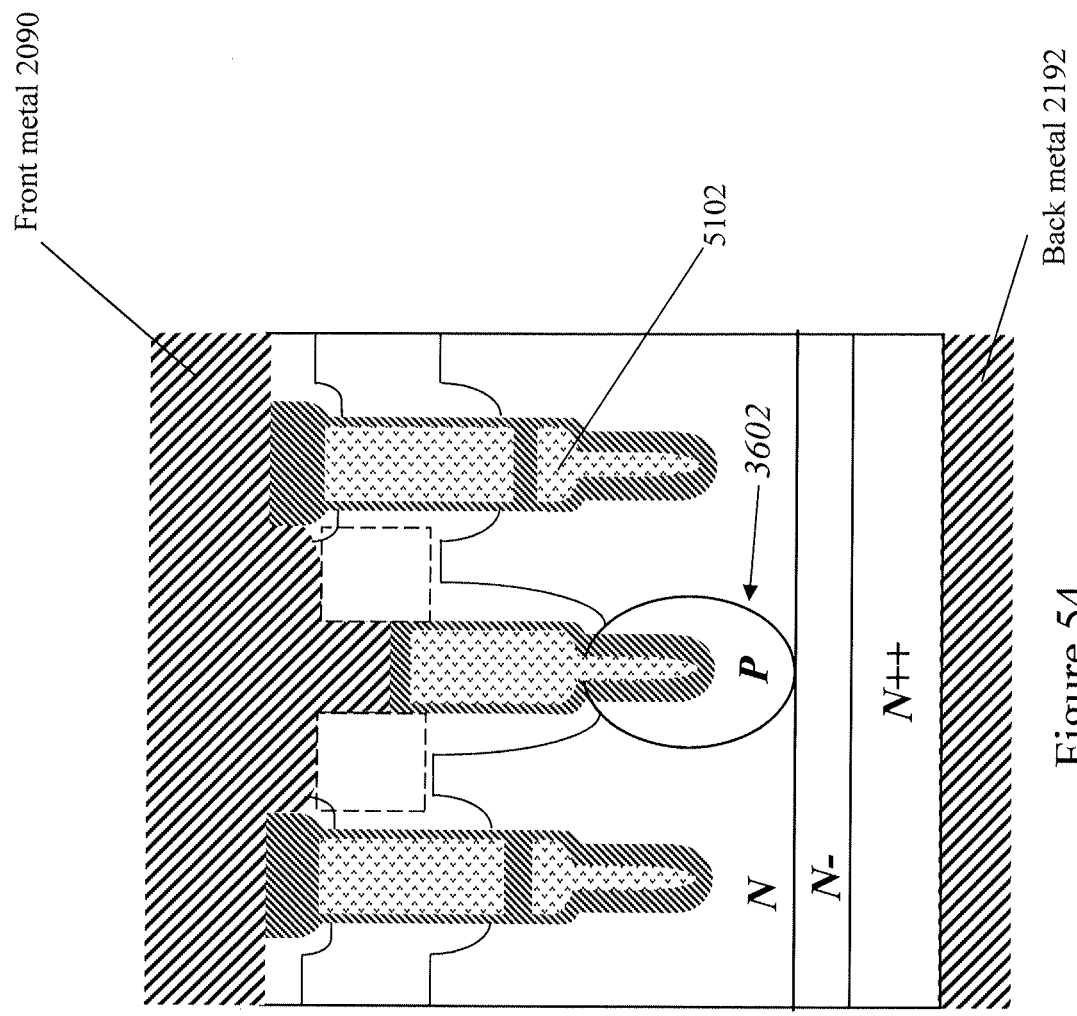
FIG. 54 shows yet another variation on various of the disclosed innovative concepts.

FIG. 54 shows a device structure which is generally somewhat similar to that of FIG. 53, except that the modified process steps of FIGS. 46-48 have been used.

Figure 55B:
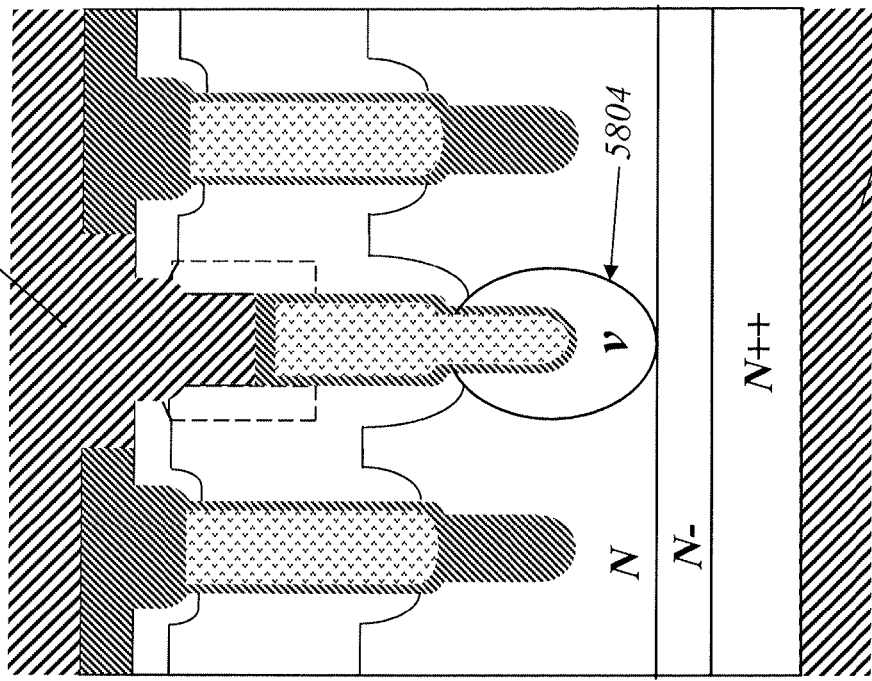
FIG. 55B shows yet another variation on various of the disclosed innovative concepts.
Figure 55A:
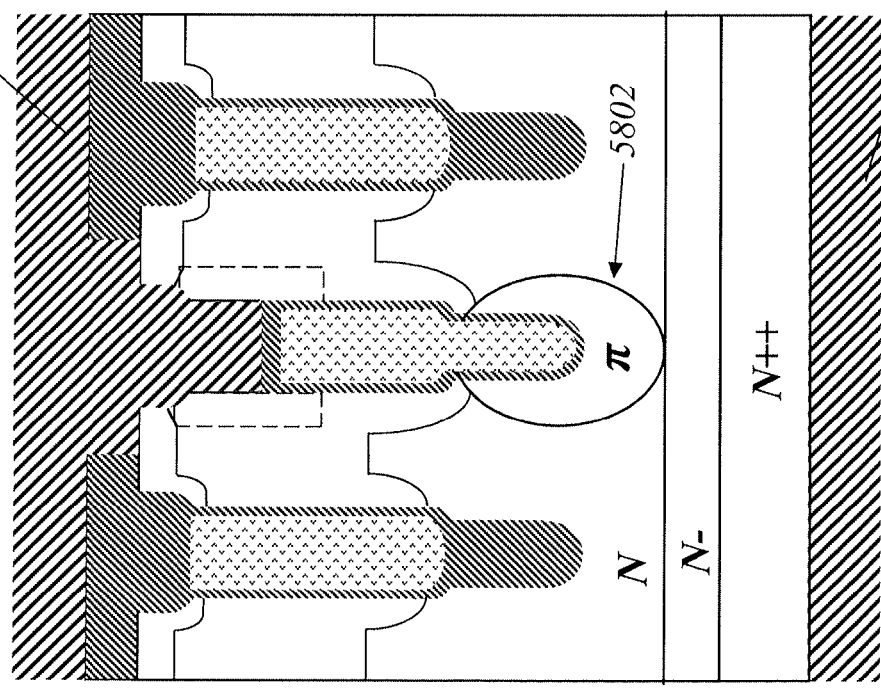
FIG. 55A shows yet another variation on various of the disclosed innovative concepts.

FIG. 55A and FIG. 55B show alternative implementations where the p-type region 3604 below the field plate has been replaced by near-intrinsic regions, of p-type and n-type respectively.

Figure 56:
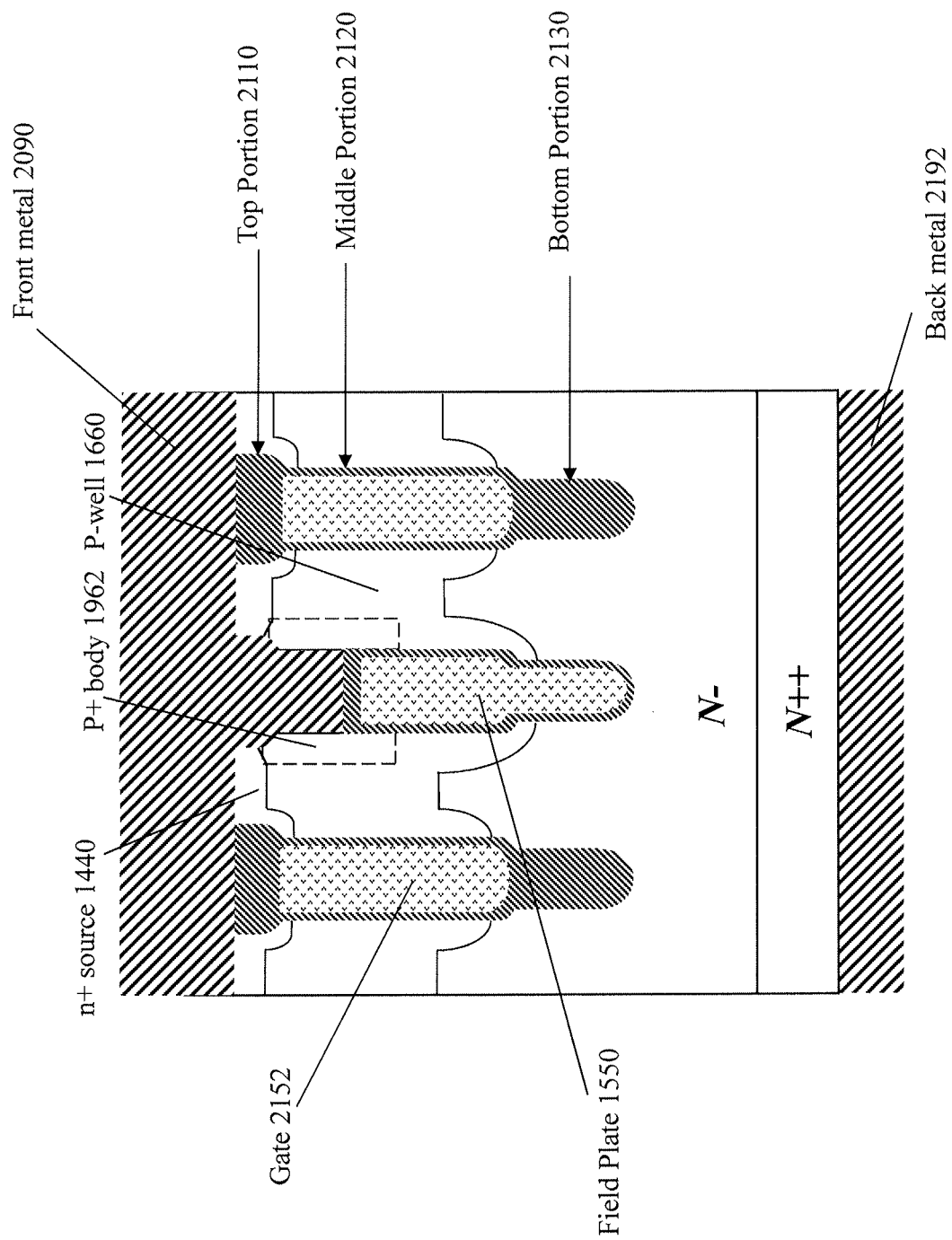
FIG. 56 shows yet another variation on various of the disclosed innovative concepts.

Another implementation of some of the disclosed inventions is shown in FIG. 56, where the source metal is planar to the silicon surface. In this example the interlevel dielectric portions 1770, which are visible in (e.g.) the examples of FIG. 17 and FIG. 45, are not present.

This structure provides a larger contact area to the source n+ region and results in reduced on-resistance. The process is slightly modified from the previously discussed flow as shown in FIGS. 57A-57D.

Figure 57B:
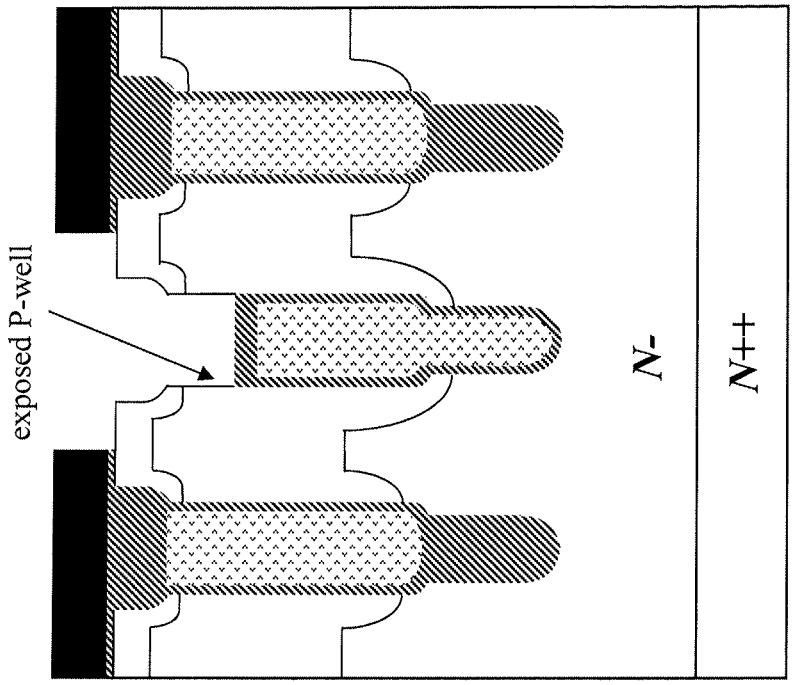
FIGS. 57A, 57B, 57C, and 57D show various stages in yet another sample process flow.
Figure 57A:
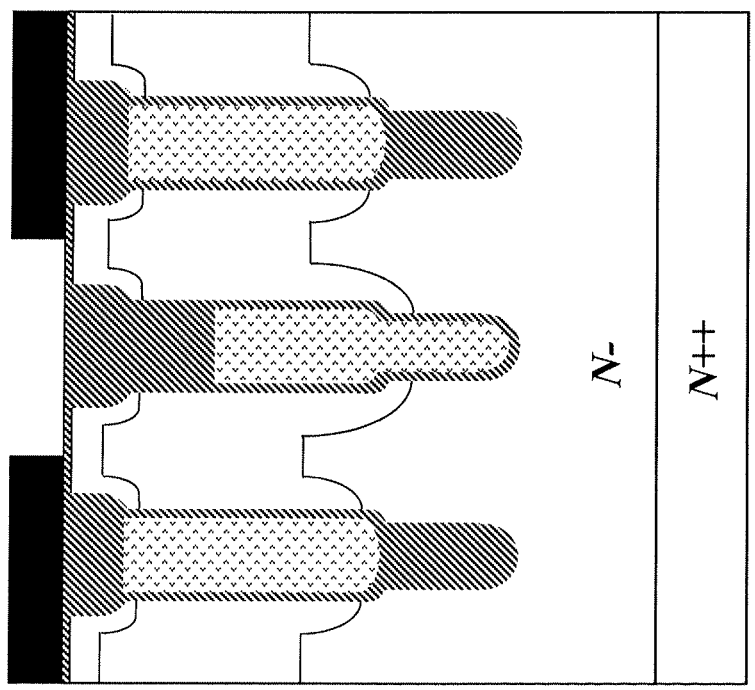
Figure 57D:
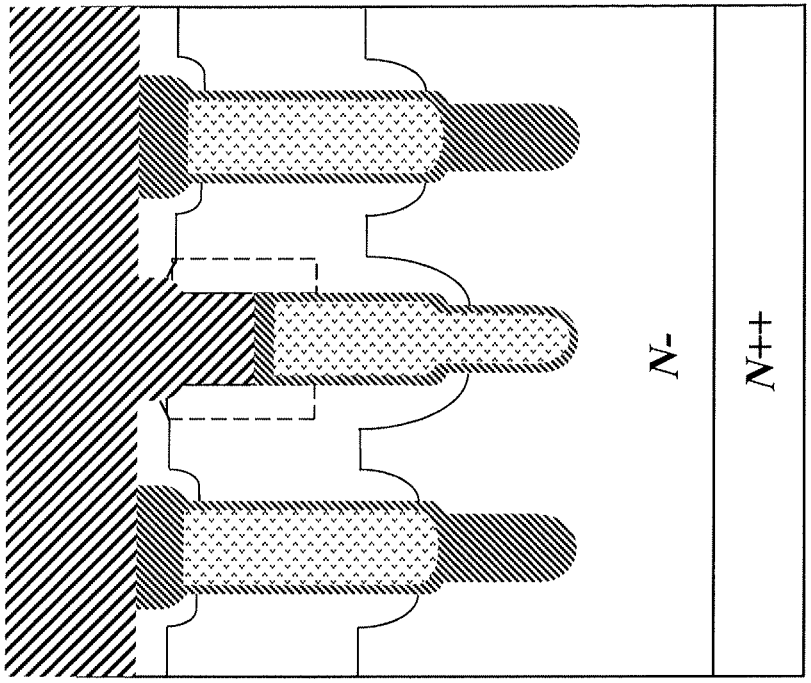
Figure 57C:
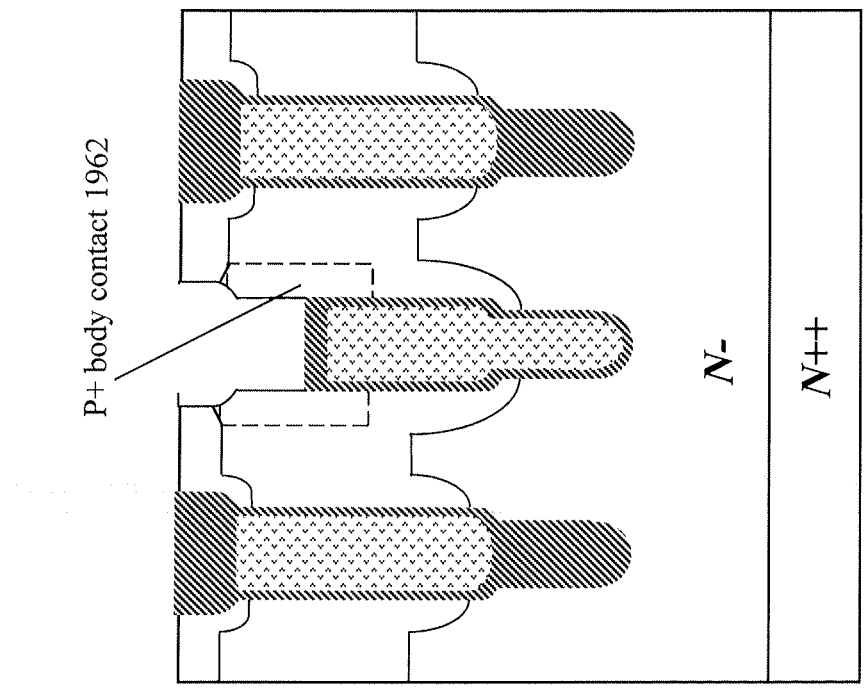

In FIG. 57A surface oxide is planarized/etched leaving a thin oxide layer (100A-300A) at the surface before applying the contact mask. After etching the contact opening (FIG. 57B) the remaining thin oxide layer at the surface is etched as shown in FIG. 57C. FIG. 57D shows the resulting structure after metallization.

Figure 58A:
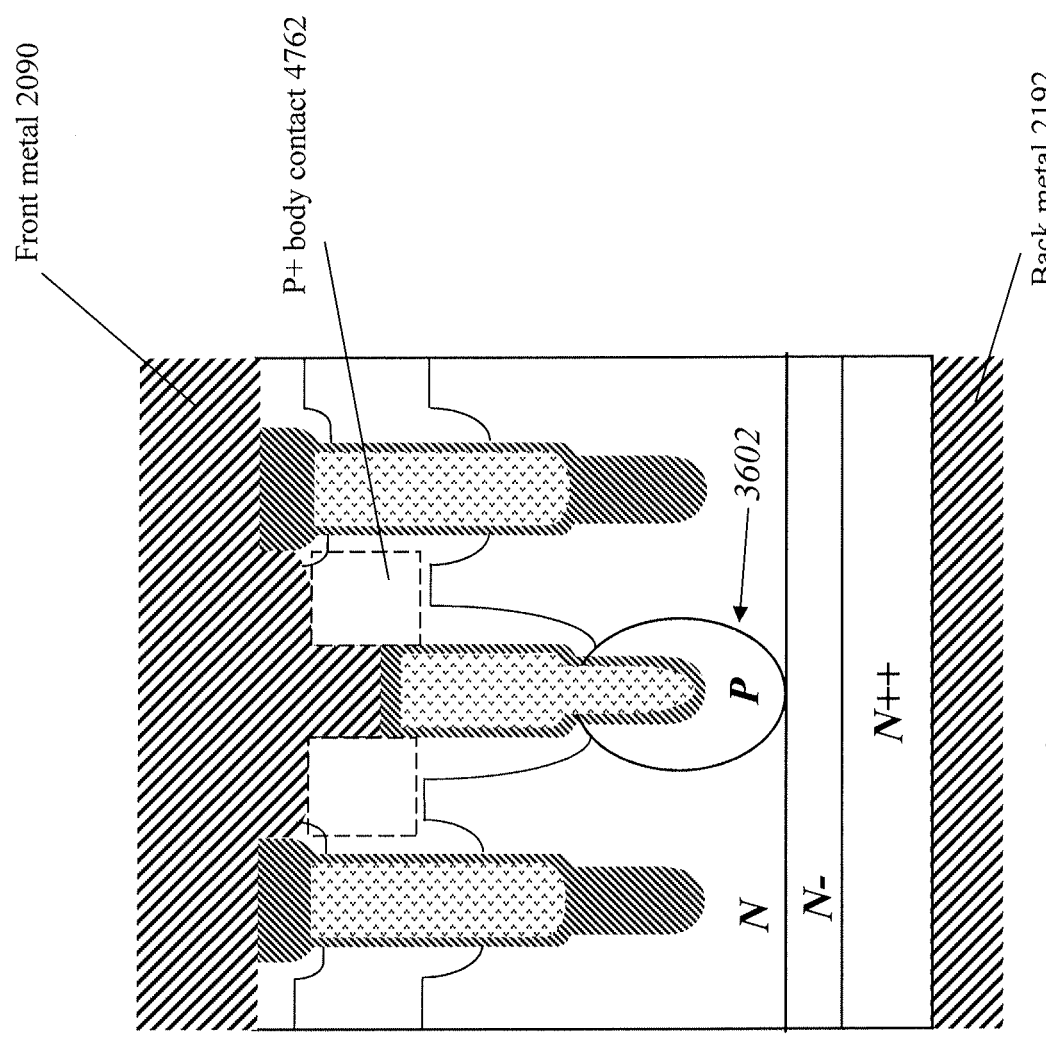
FIG. 58A shows yet another variation on various of the disclosed innovative concepts.

Other examples of the planar source metal structures are shown in FIGS. 58A-58K. FIG. 58A shows an example of an implementation which is generally somewhat similar to that of FIG. 54, except that the shield electrodes 5102 are not used.

Figure 58B:
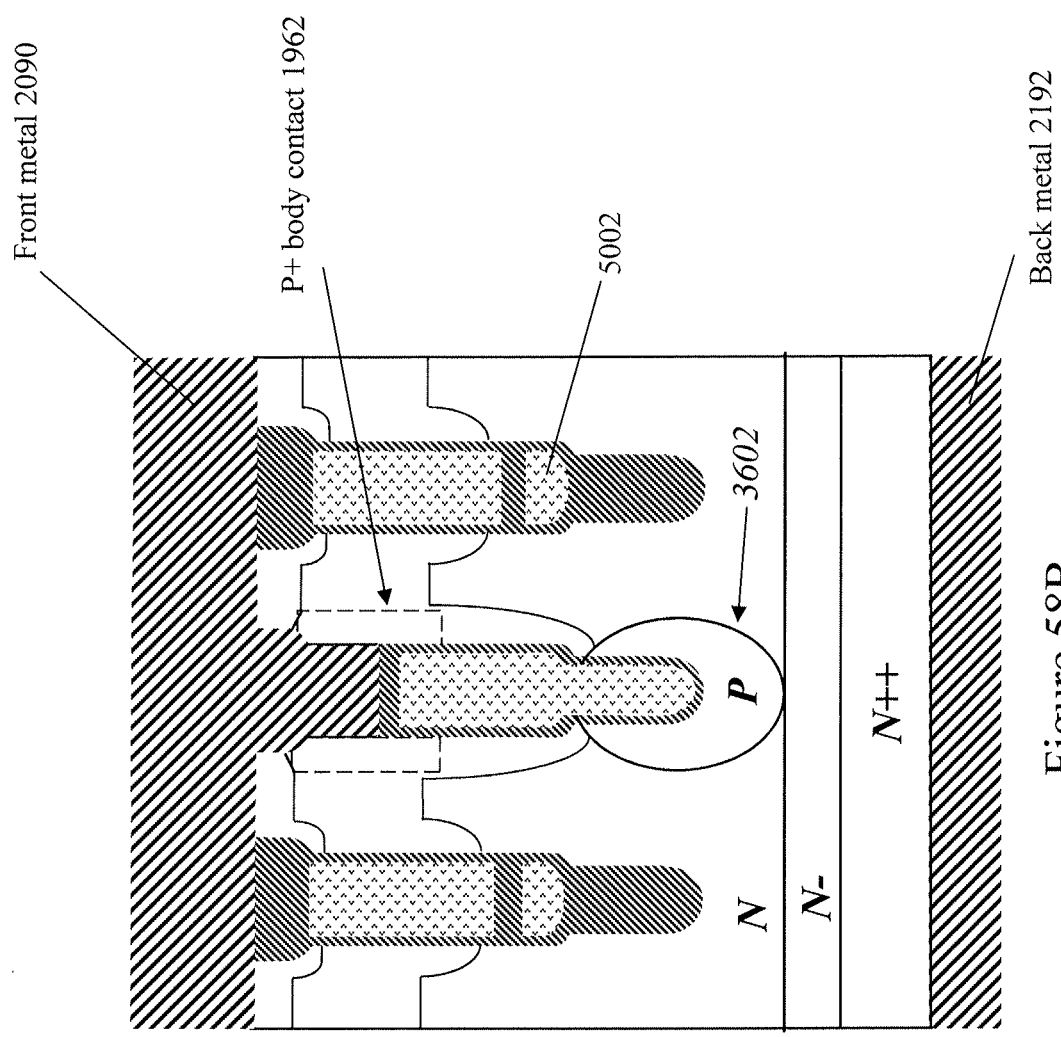
FIG. 58B shows yet another variation on various of the disclosed innovative concepts.

FIG. 58B shows an example of an implementation which is generally somewhat similar to that of FIG. 58A, except that shield electrodes 5002 are used, and p+ body contact regions 1962 are used rather than p+ body contact regions 4762.

Figure 58C:
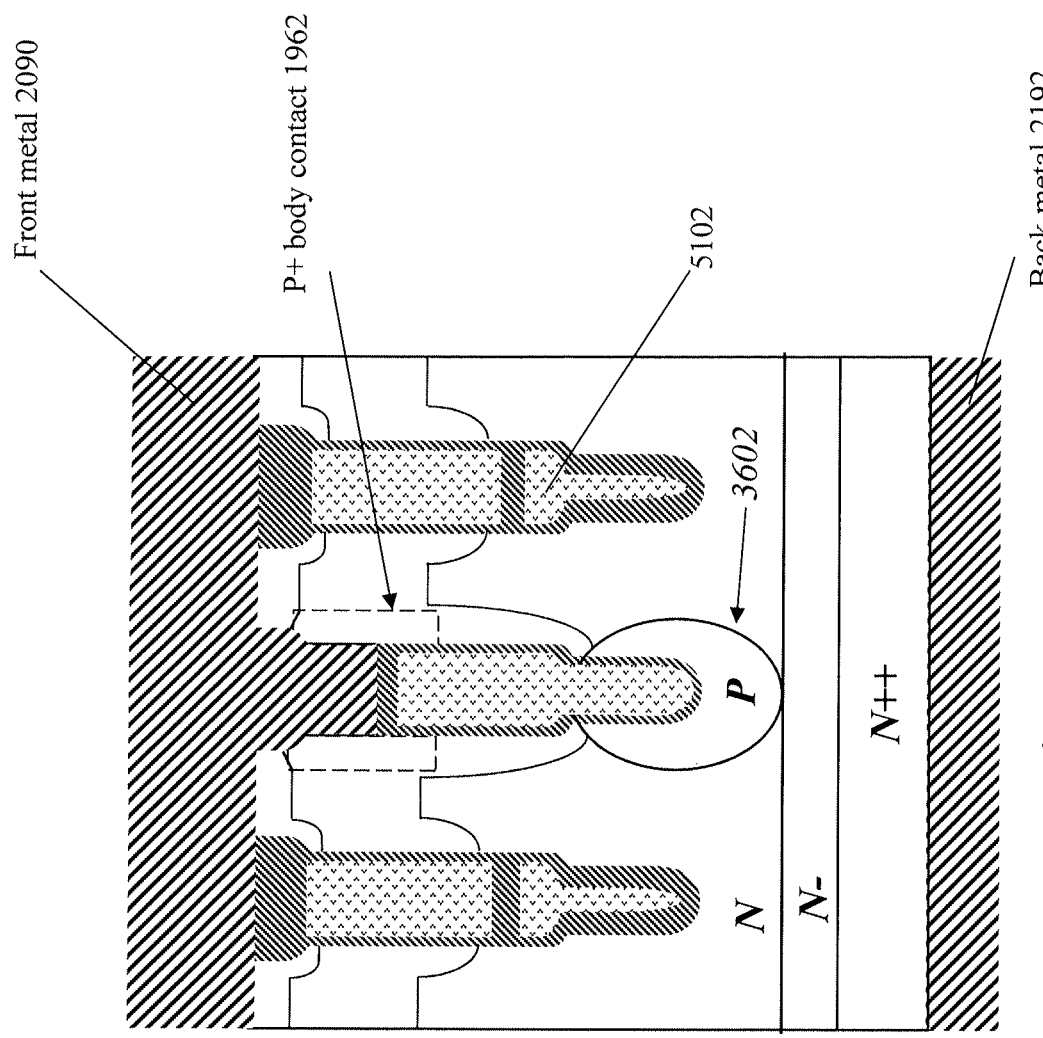
FIG. 58C shows yet another variation on various of the disclosed innovative concepts.

FIG. 58C shows an example of an implementation which is generally somewhat similar to that of FIG. 58B, except that the shield electrodes 5102 are used instead of the shield electrodes 5002.

Figure 58D:
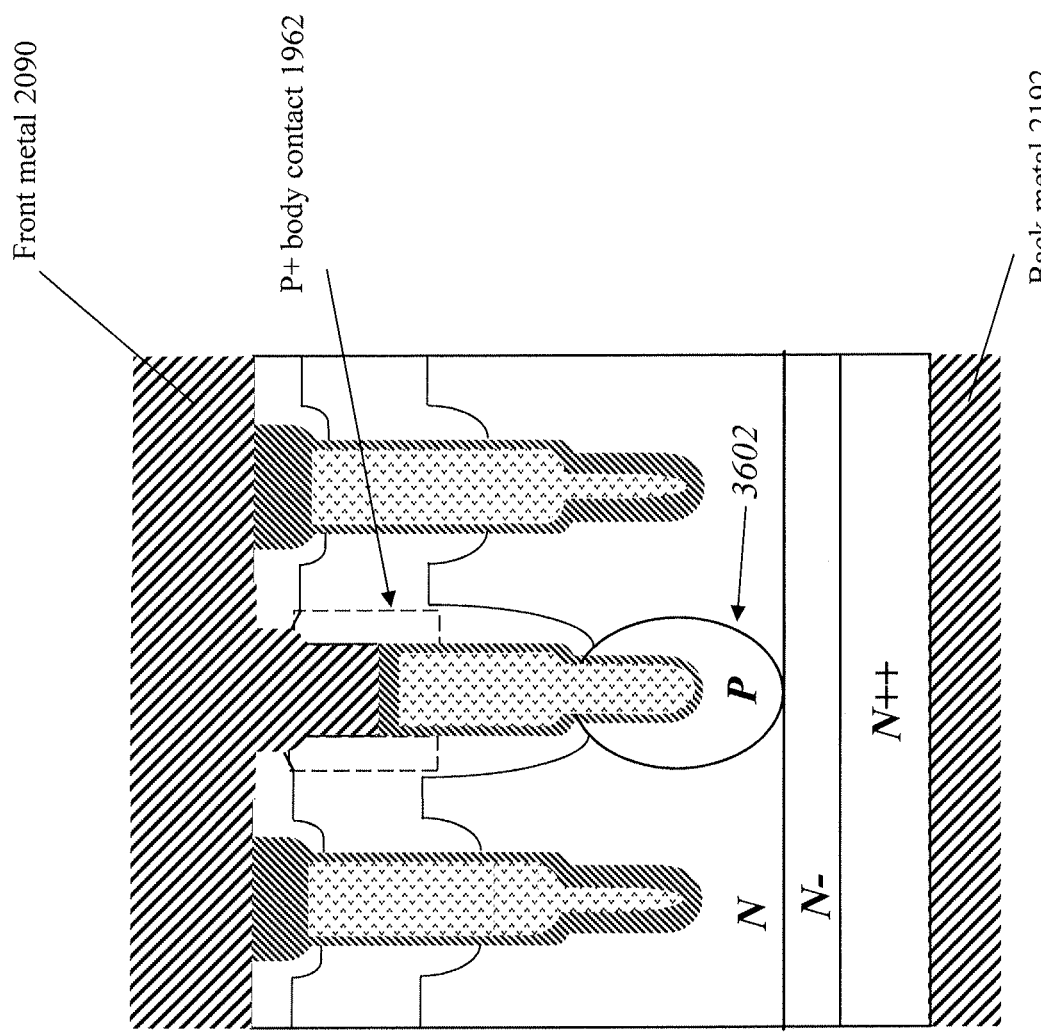
FIG. 58D shows yet another variation on various of the disclosed innovative concepts.

FIG. 58D shows an example of an implementation which is generally somewhat similar to that of FIG. 58C, except that, instead of shield electrodes 5102, the gate electrode 5252 is shaped to have a downward extension which is surrounded by thicker insulation.

Figure 58E:
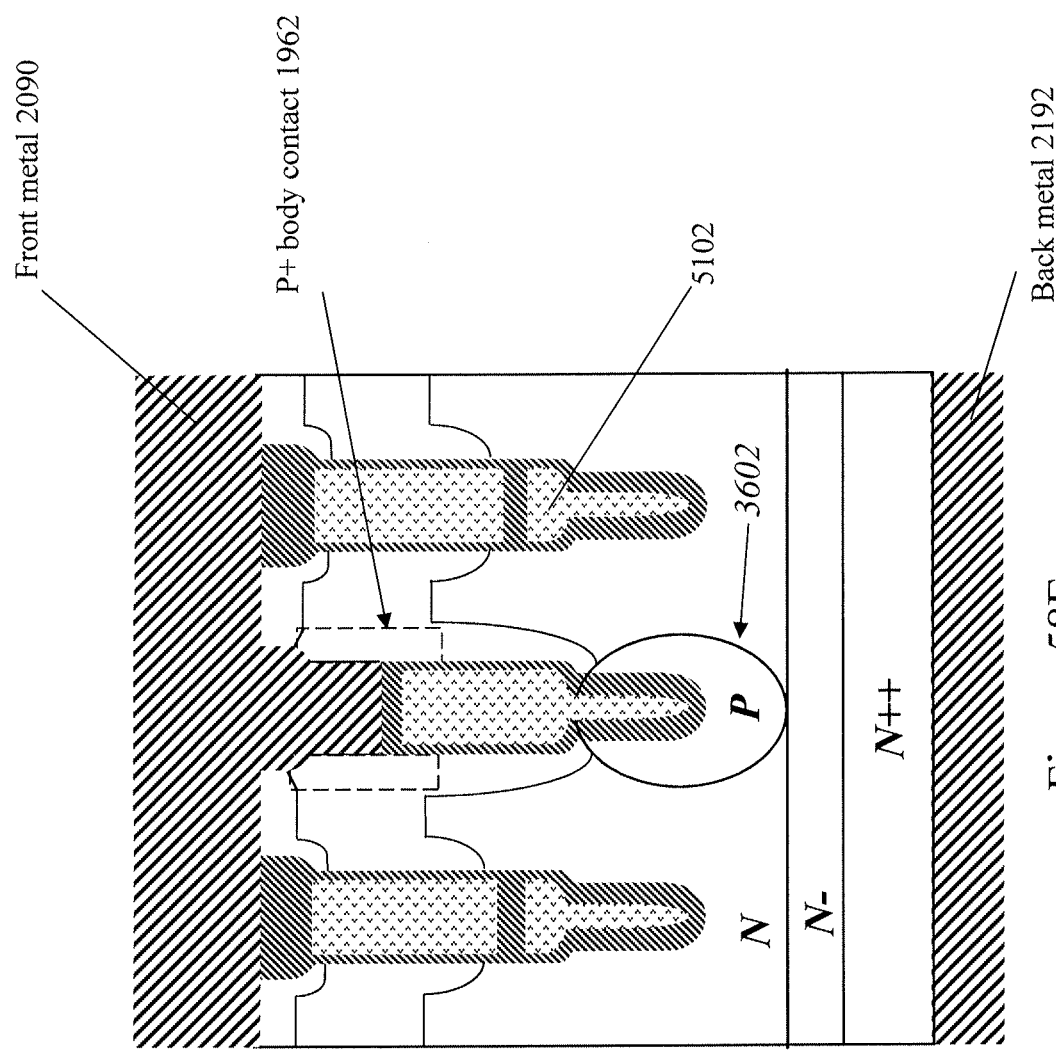
FIG. 58E shows yet another variation on various of the disclosed innovative concepts.

FIG. 58E shows an example of an implementation which is generally somewhat similar to that of FIG. 58C, except that the field plate 5350 is shaped to have a downward extension which is surrounded by thicker insulation.

Figure 58F:
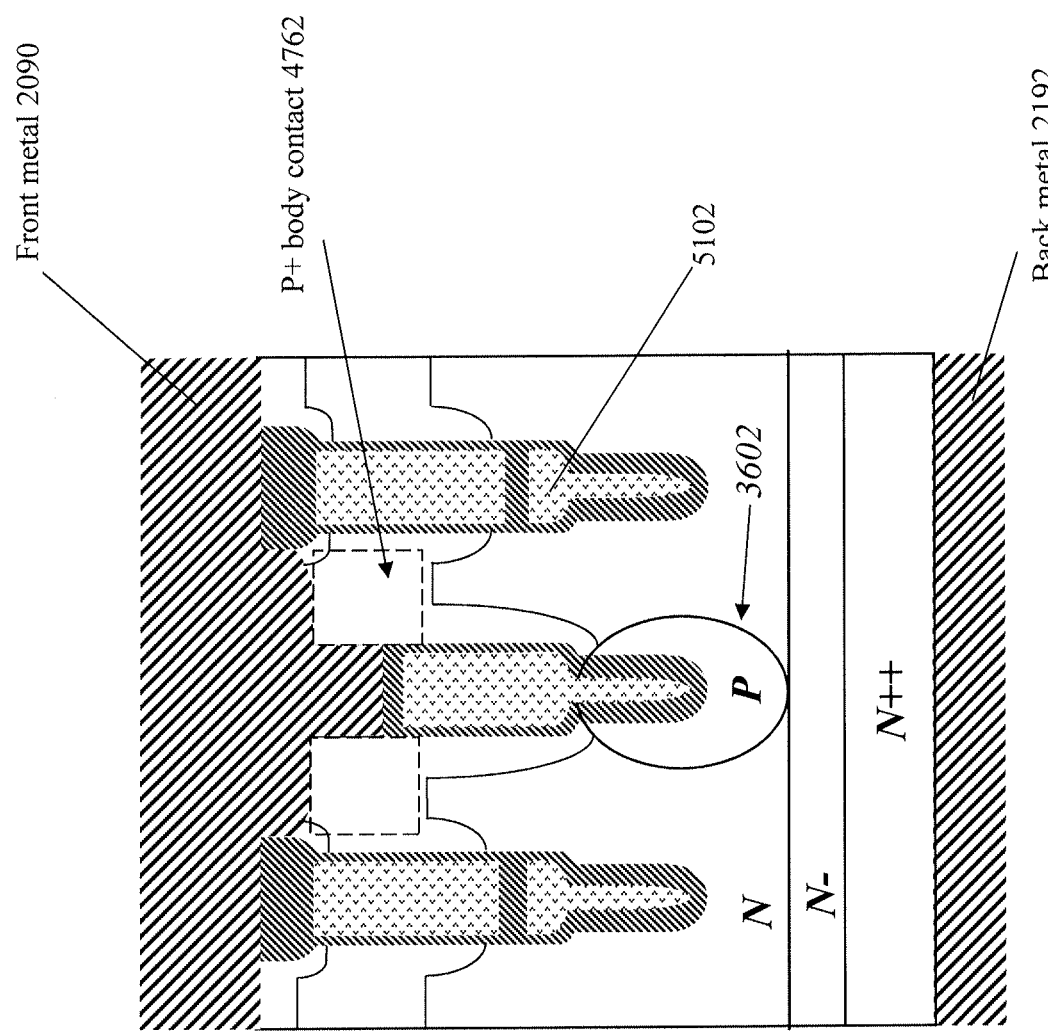
FIG. 58F shows yet another variation on various of the disclosed innovative concepts.

FIG. 58F shows an example of an implementation which is generally somewhat similar to that of FIG. 58E, except that p+ body contact regions 1962 are used rather than p+ body contact regions 4762.

Figure 58G:
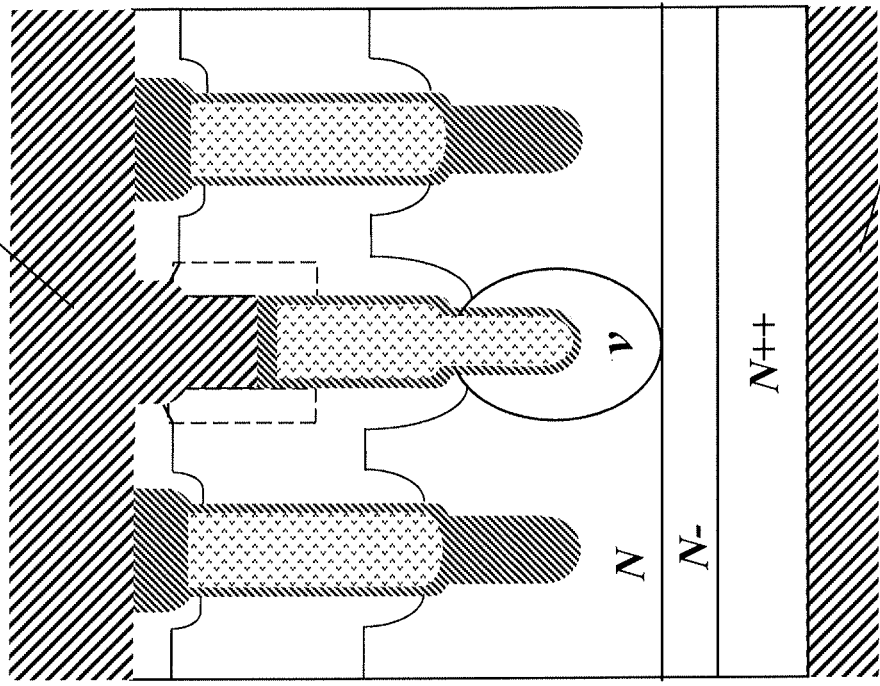
FIG. 58G shows yet another variation on various of the disclosed innovative concepts.

FIG. 58G shows an example of an implementation which is generally somewhat similar to that of FIG. 52, except that p-type region 3602 has been replaced by a region 5802 of near-intrinsic p-type doping ("π").

Figure 58H:
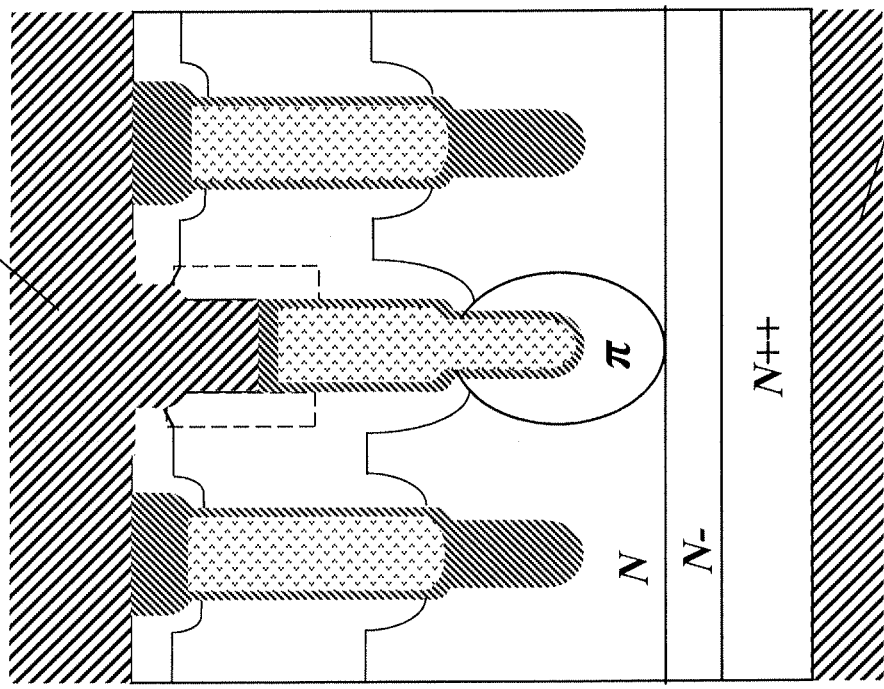
FIG. 58H shows yet another variation on various of the disclosed innovative concepts.

FIG. 58H shows an example of an implementation which is generally somewhat similar to that of FIG. 52, except that p-type region 3602 has been replaced by a region 5804 of near-intrinsic n-type doping ("ν").

Figure 58J:
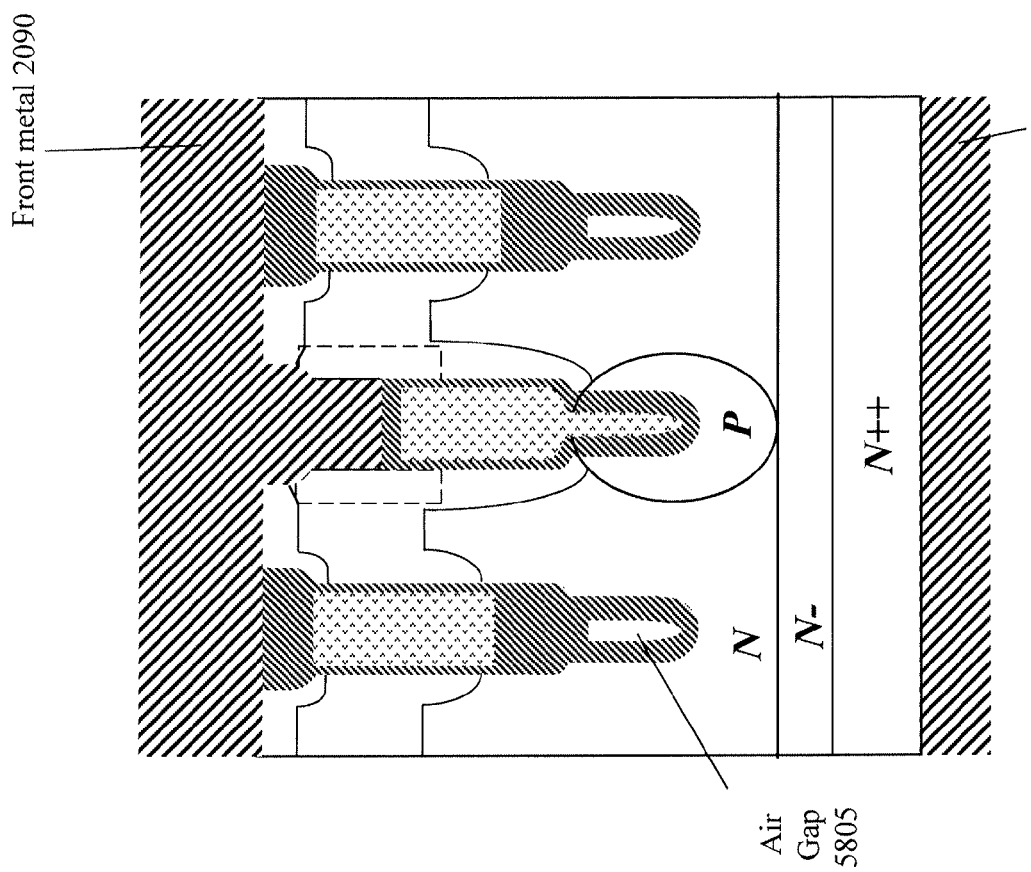
FIG. 58J shows yet another variation on various of the disclosed innovative concepts.
Figure 58I:
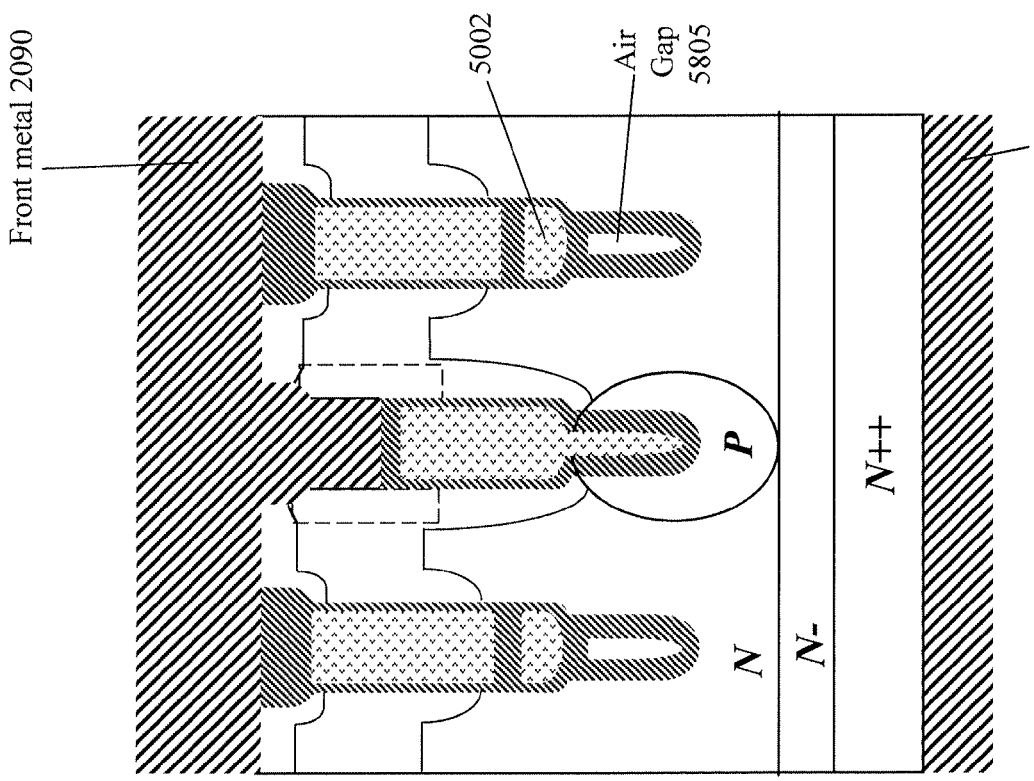
FIG. 58I shows yet another variation on various of the disclosed innovative concepts.

FIG. 58I shows an example of an implementation which is generally somewhat similar to that of FIG. 58E, except that an air gap 5805 is included below shield plates 5002.

FIG. 58J shows an example of an implementation which is generally somewhat similar to that of FIG. 58I, except for the absence of shield plates 5002.

FIG. 58K shows an example of an implementation which is generally somewhat similar to that of FIG. 58C, except that the field plate electrode is not insulated from the front metal 2090 in the locations shown.

According to some, but not necessarily all disclosed implementations, there is provided: A semiconductor device, comprising: a semiconductor mass; gate electrodes in first trenches in said semiconductor mass, and field plate electrodes in second trenches in said semiconductor mass; wherein said first trenches and said second trenches have substantially the same depth; wherein said first and said second trenches each have a top portion which is wider than a middle portion thereof which has substantially vertical sidewalls, and also a bottom portion which is narrower than said middle portion; a first-conductivity-type source region, in said semiconductor mass, near said first trenches, and a second-conductivity-type body region adjacent said first trenches, and a second-conductivity-type body contact region surrounding said second trenches.

According to some, but not necessarily all disclosed implementations, there is provided: A semiconductor device, comprising: a semiconductor mass; gate electrodes in first trenches in said semiconductor mass, and field plate electrodes in second trenches in said semiconductor mass; wherein said first trenches and said second trenches both extend into a first surface of said semiconductor mass, and all have substantially the same depth; wherein said first and said second trenches each have a top portion which is wider than a middle portion thereof which has substantially vertical sidewalls, and also a bottom portion which is narrower than said middle portion; and wherein said gate electrodes, but not said field plate electrodes, are connected directly to receive a gate drive waveform; a first-conductivity-type source region, in said semiconductor mass, near said first trenches, and a second-conductivity-type body region adjacent said first trenches, and a second-conductivity-type body contact region surrounding and self-aligned to said second trenches; and a first-conductivity-type drain region at a second surface of said semiconductor mass; whereby, in the ON state, voltage applied to said gate electrode controls majority carrier emission from said source, to thereby allow current conduction between said source and said drain; and whereby said field plate electrodes affect isopotential contours, in the OFF state, to increase the breakdown voltage between said source and said drain.

According to some, but not necessarily all disclosed implementations, there is provided: A semiconductor device, comprising: a semiconductor mass; gate electrodes in first trenches in said semiconductor mass, and field plate electrodes in second trenches in said semiconductor mass; wherein said first trenches and said second trenches have substantially the same depth; wherein said first and said second trenches each have a top portion which is wider than a middle portion thereof which has substantially vertical sidewalls, and also a bottom portion which is narrower than said middle portion; a first-conductivity-type source region, in said semiconductor mass, adjacent and self-aligned to said first trenches; a second-conductivity-type body region adjacent said first trenches; a second-conductivity-type body contact region surrounding and self-aligned to said second trenches; and modified regions, below and self-aligned to said second trenches, which have a smaller net concentration of second-conductivity-type dopants than said body region does.

According to some, but not necessarily all disclosed implementations, there is provided: A semiconductor device, comprising: a semiconductor mass; gate electrodes in first trenches in said semiconductor mass, and field plate electrodes in second trenches in said semiconductor mass; wherein said first trenches and said second trenches have substantially the same depth; wherein said first and said second trenches each have a top portion which is wider than a middle portion thereof which has substantially vertical sidewalls, and also a bottom portion which is narrower than said middle portion; a first-conductivity-type source region, in said semiconductor mass, adjacent and self-aligned to said first trenches; a second-conductivity-type body region adjacent said first trenches; a second-conductivity-type body contact region surrounding and self-aligned to said second trenches; and modified regions, below and self-aligned to said second trenches, which have a smaller net concentration of second-conductivity-type dopants than said body region does.

According to some, but not necessarily all disclosed implementations, there is provided: A semiconductor device, comprising: a semiconductor mass; gate electrodes, and shield electrodes beneath said gate electrodes, in first trenches in said semiconductor mass, and field plate electrodes in second trenches in said semiconductor mass; wherein said first trenches and said second trenches both extend into a first surface of said semiconductor mass, and all have substantially the same depth; wherein said first and said second trenches each have a top portion which is wider than a middle portion thereof which has substantially vertical sidewalls, and also a bottom portion which is narrower than said middle portion; and wherein said gate electrodes, but not said field plate electrodes, are connected directly to receive a gate drive waveform; a first-conductivity-type source region, in said semiconductor mass, near said first trenches, and a second-conductivity-type body region adjacent said first trenches, and a second-conductivity-type body contact region surrounding and self-aligned to said second trenches; and a first-conductivity-type drain region at a second surface of said semiconductor mass; whereby, in the ON state, voltage applied to said gate electrode controls majority carrier emission from said source, to thereby allow current conduction between said source and said drain; and whereby said field plate electrodes affect isopotential contours, in the OFF state, to increase the breakdown voltage between said source and said drain.

According to some, but not necessarily all disclosed implementations, there is provided: A method of fabricating a power semiconductor device, comprising: etching a plurality of trenches into a semiconductor mass, using at least two sidewall spacer operation to form individual ones of said trenches with a stepped width; providing a dielectric which fills lowermost portions of first ones of said trenches, but not second ones of said trenches; forming insulated gate electrodes in said first trenches, but not in said second trenches; forming a first-conductivity-type source region and a second-conductivity-type body region in proximity to said first trenches; forming second-conductivity-type body contact regions in said sc mass adjacent said second trenches; and electrically connecting said source, gate, and body contact regions to provide an operative active device.

According to some, but not necessarily all disclosed implementations, there is provided: Power devices, and related process, where both gate and field plate trenches have multiple stepped widths, using self-aligned process steps.

The disclosed innovations, in various alternative implementations, provide one or more of at least the following advantages. However, not all of these advantages result from every one of the innovations disclosed, and this list of advantages does not limit the various claimed inventions.

Higher breakdown voltage, for a given on-state current density;
Higher breakdown voltage;
Higher on-state current density;
Higher on-state current density for a given breakdown voltage;
Denser layout;
Simpler fabrication; and
Less process variation in the electrical characteristics of finished devices.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

All the above variants of the structure can be realized in stripe or cellular layout such as square, rectangular, hexagonal or circular layouts.

The disclosed inventions are also applicable to p-channel devices, with reversal of voltage, dopant, and permanent charge polarities.

Even though the embodiments above are for MOSFET structures, the various disclosed inventions are applicable to other devices such as Insulated Gate Bipolar Transistors (IGBTs), thyristors, and other devices that can block voltages.

For another example, the semiconductor material does not necessarily have to be silicon, as in the preferred embodiment. This can alternatively be SiGe or SiGeC or other Group IV semiconductor alloy.

It is understood that numerous combinations of the above embodiments are also possible.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be combined synergistically with the inventions claimed below, may be found in the following patent applications. All of these applications have at least some common ownership, copendency, and inventorship with the present application. All of these applications, and all of their priority applications, are hereby incorporated by reference:

published PCT application WO2012006261;
published PCT application WO2011133481;
published PCT application WO2011087994;
published PCT application WO2011035331;
published PCT application WO2011008717;
published PCT application WO2010120704;
published PCT application WO2010098742;
published US application US20080073707;
published US application US20080191307;
published US application US20080164516;
published US application US20080164518;
published US application US20080164520;
published US application US20080166845;
published US application US20090206924;
published US application US20090206913;
published US application US20090294892;
published US application US20090309156;
published US application US20100013552;
published US application US20100025726;
published US application US20100025763;
published US application US20100084704;
published US application US20100219462;
published US application US20100219468;
published US application US20100214016;
published US application US20100308400;
published US application US20100327344;
published US application US20110006361;
published US application US20110039384;
published US application US20110079843;

published US application US20110169103;
published US application US20110193131;
published US application US20110254088;
published US application US20110220998;
published US application US20110298043;
published US application US20120098056;
published US application US20120098055;
published US application US20120043602;
published US application US20120032258;
published US application US20120098055;
published US application US20120098056;
unpublished U.S. application Ser. No. 12/369,385;
unpublished U.S. application Ser. No. 12/720,856;
unpublished U.S. application Ser. No. 12/835,636;
unpublished U.S. application Ser. No. 12/939,154;
unpublished U.S. application Ser. No. 13/212,044;
unpublished U.S. application Ser. No. 13/418,615.

Applicants reserve the right to claim priority from these applications, directly or indirectly, and therethrough to even earlier applications, in all countries where such priority can be claimed.

Further background, and indications of variations which will be immediately understood by persons of ordinary skill in the art, can be found e.g. in B. Baliga, Modern Power Devices (1992); B. Baliga, Fundamentals of Power Semiconductor Devices (2008); and all of the annual proceedings of the ISPSD symposia; all of which are hereby incorporated by reference.

The claims as filed are intended to be as comprehensive as possible, and NO subject matter is intentionally relinquished, dedicated, or abandoned.

What is claimed is:

1. A semiconductor device, comprising:
a semiconductor mass;
gate electrodes in first trenches in said semiconductor mass, and field plate electrodes in second trenches in said semiconductor mass;
wherein said first trenches and said second trenches have substantially the same depth;
wherein said first and said second trenches each have stepped sides having at least three distinct widths, wherein a top portion of each said trench is wider than a middle portion thereof which has substantially vertical sidewalls, and a bottom portion thereof is narrower than said middle portion;
wherein said first and said second trenches are not identical;
a first-conductivity-type source region, in said semiconductor mass, near said first trenches, and a second-conductivity-type body region adjacent said first trenches, and a second-conductivity-type body contact region surrounding said second trenches.

2. The semiconductor device of claim 1, wherein said first conductivity type is n-type, and said second conductivity type is p-type.

3. The semiconductor device of claim 1, wherein said semiconductor mass consists essentially of silicon.

4. The semiconductor device of claim 1, wherein said gate electrodes are made of doped polysilicon.

5. The semiconductor device of claim 1, wherein said middle portion of each said trench has a greater vertical extent than said bottom portion thereof, and said bottom portion of each said trench has a greater vertical extent than said top portion thereof 6. The semiconductor device of claim 1, wherein said gate electrode does not extend into said bottom portion of said first trench, and said field plate electrode does extend into said bottom portion of said second trench.

7. The semiconductor device of claim 1, wherein doping for said body region is provided by a well diffusion process.

8. A semiconductor device, comprising:
a semiconductor mass;
gate electrodes in first trenches in said semiconductor mass, and field plate electrodes in second trenches in said semiconductor mass;
wherein said first trenches and said second trenches both extend into a first surface of said semiconductor mass, and all have substantially the same depth;
wherein said first and said second trenches each have stepped sides having at least three distinct widths, wherein a top portion of each said trench is wider than a middle portion thereof which has substantially vertical sidewalls, and a bottom portion thereof is narrower than said middle portion;
wherein said first and said second trenches are not identical;
and wherein said gate electrodes, but not said field plate electrodes, are connected directly to receive a gate drive waveform;
a first-conductivity-type source region, in said semiconductor mass, near said first trenches, and a second-conductivity-type body region adjacent said first trenches, and a second-conductivity-type body contact region surrounding and self-aligned to said second trenches; and
a first-conductivity-type drain region at a second surface of said semiconductor mass;
whereby, in the ON state, voltage applied to said gate electrode controls majority carrier emission from said source, to thereby allow current conduction between said source and said drain; and whereby said field plate electrodes affect isopotential contours, in the OFF state, to increase the breakdown voltage between said source and said drain.

9. The semiconductor device of claim 8, wherein said first conductivity type is n-type, and said second conductivity type is p-type.

10. The semiconductor device of claim 8, wherein said semiconductor mass consists essentially of silicon.

11. The semiconductor device of claim 8, wherein said gate electrodes are made of doped polysilicon.

12. The semiconductor device of claim 8, wherein said middle portion of each said trench has a greater vertical extent than said bottom portion thereof, and said bottom portion of each said trench has a greater vertical extent than said top portion thereof 13. The semiconductor device of claim 8, wherein said gate electrode does not extend into said bottom portion of said first trench, and said field plate electrode does extend into said bottom portion of said second trench.

14. The semiconductor device of claim 8, wherein doping for said body region is provided by a well diffusion process.

15. A semiconductor device, comprising:
a semiconductor mass;
gate electrodes in first trenches in said semiconductor mass, and field plate electrodes in second trenches in said semiconductor mass;
wherein said first trenches and said second trenches have substantially the same depth;
wherein said first and said second trenches each have stepped sides having at least three distinct widths, wherein a top portion of each said trench is wider than a middle portion thereof which has substantially vertical sidewalls, and a bottom portion thereof is narrower than said middle portion;

wherein said first and said second trenches are not identical;

a first-conductivity-type source region, in said semiconductor mass, adjacent and self-aligned to said first trenches;

a second-conductivity-type body region adjacent said first trenches;

a second-conductivity-type body contact region surrounding and self-aligned to said second trenches; and modified regions, below and self-aligned to said second trenches, which have a smaller net concentration of second-conductivity-type dopants than said body region does.

16. The semiconductor device of claim 15, wherein said modified regions are near-intrinsic.

17. The semiconductor device of claim 15, wherein said modified regions have the same conductivity type as said body region.

18. The semiconductor device of claim 15, wherein said first conductivity type is n-type, and said second conductivity type is p-type.

19. The semiconductor device of claim 15, wherein said semiconductor mass consists essentially of silicon.

20. The semiconductor device of claim 15, wherein said gate electrodes are made of doped polysilicon.

* * * * *